(12) United States Patent
Jeong

(10) Patent No.: US 11,451,223 B2
(45) Date of Patent: Sep. 20, 2022

(54) DRIVER AND METHOD OF OPERATING THE SAME

(71) Applicant: SK hynix Inc., Gyeonggi-do (KR)

(72) Inventor: Chan Hui Jeong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/167,553

(22) Filed: Feb. 4, 2021

(65) Prior Publication Data
US 2022/0052681 A1  Feb. 17, 2022

(30) Foreign Application Priority Data
Aug. 12, 2020  (KR) .................. 10-2020-0101442

(51) Int. Cl.
| G11C 7/10 | (2006.01) |
| H03K 17/10 | (2006.01) |
| G06F 3/06 | (2006.01) |
| G11C 7/22 | (2006.01) |

(52) U.S. Cl.
CPC ......... *H03K 17/102* (2013.01); *G06F 3/0611* (2013.01); *G06F 3/0656* (2013.01); *G11C 7/10* (2013.01); *G11C 7/22* (2013.01); *G11C 7/109* (2013.01); *G11C 7/1063* (2013.01)

(58) Field of Classification Search
CPC ... H03K 17/102; G06F 3/0611; G06F 3/0656; G11C 7/10; G11C 7/22; G11C 7/1063; G11C 7/109
See application file for complete search history.

(56) References Cited

U.S. PATENT DOCUMENTS

| 6,434,042 | B1 * | 8/2002 | Lee | ........................ | G11C 8/08 |
| | | | | | 365/185.12 |
| 2012/0230103 | A1 * | 9/2012 | Choe | .................... | H01L 29/7926 |
| | | | | | 365/185.18 |

FOREIGN PATENT DOCUMENTS

| KR | 10-2015-0080998 | 7/2015 |
| KR | 10-2019-0029014 | 3/2019 |

* cited by examiner

*Primary Examiner* — Jay W. Radke
(74) *Attorney, Agent, or Firm* — IP & T Group LLP

(57) ABSTRACT

The present technology relates to an electronic device. A driver for generating a signal that satisfies a characteristic required according to a type of a signal includes a current controller configured to control total current flowing through the driver based on a selected signal, among a plurality of signals, applied to a page buffer that stores data, a load controller configured to control a magnitude of a load of an output terminal of the driver based on the selected signal and a cap compensator configured to control the magnitude of the load of the output terminal by increasing or decreasing a capacitance of the load of the output terminal based on the selected signal.

20 Claims, 20 Drawing Sheets

DRIVER AND METHOD OF OPERATING THE SAME

CROSS-REFERENCE TO RELATED APPLICATION

The present application claims priority under 35 U.S.C. § 119(a) to Korean patent application number 10-2020-0101442, filed on Aug. 12, 2020, which is incorporated herein by reference in its entirety.

BACKGROUND

1. Field of Invention

The present disclosure relates to an electronic device, and more particularly, to a driver and a method of operating the same.

2. Description of Related Art

A storage device stores data under control of a host device such as a computer, a smart phone, or a smart pad. The storage device may be a hard disk drive (HDD) that stores data in a magnetic disk, or a semiconductor memory that stores data such as a solid state drive (SSD), or a memory card. In particular, the semiconductor memory may be a non-volatile memory.

The storage device may include a memory device in which data is stored and a memory controller that stores data in the memory device. Generally, a memory device may be classified as a volatile memory or a non-volatile memory. Examples of non-volatile memories include a read only memory (ROM), a programmable ROM (PROM), an electrically programmable ROM (EPROM), an electrically erasable and programmable ROM (EPM), a flash memory, a phase-change RAM (PRAM), a magnetic RAM (MRAM), a resistive RAM (RRAM), a ferroelectric RAM (FRAM) and the like.

SUMMARY

An embodiment of the present disclosure provides a driver that generates a signal requiring a rising time, a stability, or a fast recovery characteristic, and a method of operating the same.

A driver according to an embodiment of the present disclosure may include a current controller configured to control total current flowing through the driver based on a selected signal, among a plurality of signals, to be applied to a page buffer that stores data, a load controller configured to control a magnitude of a load of an output terminal of the driver based on the selected signal and a cap compensator configured to control the magnitude of the load of the output terminal by increasing or decreasing a capacitance of the load of the output terminal based on the selected signal.

A method of operating a driver according to an embodiment of the present disclosure may include determining a selected signal among a plurality of signals to be applied to a page buffer that stores data, controlling a total current flowing through the driver based on the selected signal, controlling a magnitude of a load of an output terminal of the driver based on the selected signal and controlling the magnitude of the load of the output terminal by increasing or decreasing a capacitance of the load of the output terminal based on the selected signal.

A memory device including a page buffer that stores data according to an embodiment of the present disclosure may include a multiplexer configured to output a voltage signal from among a plurality of voltage signals based on an enable signal, a driver configured to control total current flowing through the driver and a magnitude of a load of an output terminal of the driver based on the voltage signal output from the multiplexer and a control signal generator configured to generate the signal to be applied to the page buffer based on a drive input signal output from the output terminal of the driver.

An integrated circuit according to an embodiment of the present disclosure may include a driver configured to receive a voltage to generate a drive input signal and a control signal generator configured to receive the drive input signal to generate a sense signal, wherein the driver is further configured to reduce total current flowing through the driver and reduce a load of an output terminal of the driver, while the control signal generator is operably disengaged from the driver, and wherein the driver is further configured to increase the total current and increase the load when the control signal generator is electrically coupled to the driver.

An integrated circuit according to an embodiment of the present disclosure may include a driver configured to receive a voltage to generate a drive input signal and a control signal generator configured to receive the drive input signal to generate a sense signal, wherein the driver is further configured to increase total current flowing through the driver and increase a load of an output terminal of the driver, while the control signal generator is electrically coupled to the driver.

According to the present technology, in order to generate a signal that satisfies a particular characteristic according to a type of the signal applied to the page buffer, a signal that satisfies the characteristic may be generated by controlling at least one of a current flowing through the driver and the output terminal load.

DETAILED DESCRIPTION

Specific structural and functional description is provided herein only to describe embodiments of the present disclosure. The invention, however, may be implemented in various forms and carried out in various ways. Thus, the invention is not limited to the embodiments described herein. Also, throughout the specification, reference to "an embodiment," "another embodiment" or the like is not necessarily to only one embodiment, and different references to any such phrase are not necessarily to the same embodiment(s).

Embodiments of the present disclosure are described in detail below with reference to the accompanying drawings, so that those skilled in the art to which the present disclosure pertains may practice and easily carry out the invention.

Figure 1:
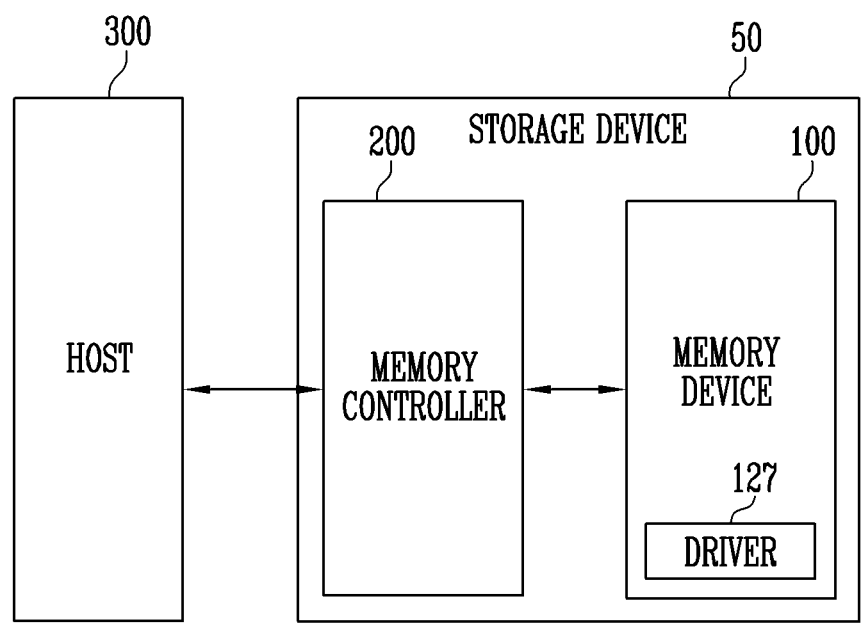
FIG. 1 is a block diagram illustrating a storage device.

FIG. 1 is a block diagram illustrating a storage device.

Referring to FIG. 1, the storage device 50 may include a memory device 100 and a memory controller 200.

The storage device 50 may store data under control of a host 300 such as a cellular phone, a smartphone, an MP3 player, a laptop computer, a desktop computer, a game player, a TV, a tablet PC, or an in-vehicle infotainment system.

The storage device 50 may be manufactured or configured as any of various types of storage devices according to a host interface that is a communication method with the host 300. For example, the storage device 50 may be configured as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and/or a memory stick.

The storage device 50 may be manufactured as any one of various types of packages. For example, the storage device 50 may be manufactured as a package on package (POP), a system in package (SIP), a system on chip (SOC), a multichip package (MCP), a chip on board (COB), a wafer-level fabricated package (WFP), and/or a wafer-level stack package (WSP).

The memory device 100 may store data. The memory device 100 operates in response to control of the memory controller 200. The memory device 100 may include a memory cell array including a plurality of memory cells storing the data. The memory cell array may include a plurality of memory blocks. Each of the memory blocks may include a plurality of memory cells, and the plurality of memory cells may configure a plurality of pages. In an embodiment, a page may be a unit for storing data in the memory device 100 or reading data stored in the memory device 100. The memory block may be a unit for erasing data.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), a spin transfer torque random access memory (STT-RAM), or the like. In the present specification, by way of example, it is assumed that the memory device 100 is a NAND flash memory.

The memory device 100 may be implemented as a two-dimensional array structure or a three-dimensional array structure. Hereinafter, the three-dimensional array structure is described as an embodiment, but the present disclosure is not limited to the three-dimensional array structure. The present disclosure may be applied not only to a flash memory device in which a charge storage layer is configured of a conductive floating gate (FG), but also to a charge trap flash (CTF) in which the charge storage layer is configured of an insulating film.

In an embodiment, the memory device 100 may operate in a single level cell (SLC) method in which one data bit is stored in one memory cell. Alternatively, the memory device 100 may operate in a method of storing at least two data bits in one memory cell. For example, the memory device 100 may operate in a multi-level cell (MLC) method of storing two data bits in one memory cell, a triple level cell (TLC) method of storing three data bits in one memory cell, or a quadruple level cell (QLC) method of storing four data bits in one memory cell.

The memory device 100 is configured to receive a command and an address from the memory controller 200 and access a region selected by the address in the memory cell array. That is, the memory device 100 may perform an operation corresponding to the command on the region selected by the address. For example, the memory device 100 may perform a write operation (program operation), a read operation, or an erase operation according to the received command. For example, when a program command is received, the memory device 100 may program data to the region selected by the address. When a read command is received, the memory device 100 may read data from the region selected by the address. When an erase command is received, the memory device 100 may erase data stored in the region selected by the address.

The memory device 100 may include a plurality of page buffers, which may temporarily store data to be programmed in the memory cells in the memory cell array of the memory device 100 or previously-programmed data read from the memory cells. Such data may be temporarily stored in latches in the plurality of page buffers.

To temporarily store data to be programmed or read data in the page buffer, signals to be applied to the page buffer are generated. The applied signals may be for turning on or turning off transistors configuring the page buffer.

In an embodiment, the signals applied to the page buffer may be generated through a driver 127. For example, the signal applied to the page buffer may be generated based on a voltage signal applied to the driver 127.

However, due to miniaturization of the memory device 100, the driver may not be individually configured to apply each signal to the page buffer. Thus, the signals to be applied to the page buffer may be generated through a merge driver in which a plurality of drivers are merged.

Furthermore, using one merged driver to generate the signals instead of multiple drivers, there is a concern that appropriate characteristics of each signal applied to the page buffer may not be satisfied.

Accordingly, in the present disclosure, in order to provide each signal applied to the page buffer in a merge driver structure with that signal's appropriate characteristic, the driver 127 includes a current controller that controls a current flowing through the driver 127, a load controller that adjusts a magnitude of a load of an output terminal of the driver 127, and a cap compensator that compensates a capacitance for preventing signal magnitude reduction or controlling a fast recovery characteristic. Namely, the cap compensator may increase or decrease the capacitance for compensating.

The memory controller 200 may control overall operation of the storage device 50.

When a power voltage is applied to the storage device 50, the memory controller 200 may execute firmware. When the memory device 100 is a flash memory device 100, the memory controller 200 may operate firmware such as a flash translation layer (FTL) for controlling communication between the host 300 and the memory device 100.

In an embodiment, the memory controller 200 may include firmware (not shown) that may receive data and a logical block address (LBA) from the host 300 and translate the LBA into a physical block address (PBA) indicating an address of memory cells in which data is to be stored. In addition, the memory controller 200 may store a logical-physical address mapping table configuring a mapping relationship between the LBA and the PBA in a buffer memory.

The memory controller 200 may control the memory device 100 to perform the program operation, the read operation, the erase operation, or the like according to a request of the host 300. For example, when a program request is received from the host 300, the memory controller 200 may convert the program request into a program command, and may provide the program command, the PBA, and data to the memory device 100. When a read request is received from the host 300 together with the LBA, the memory controller 200 may convert the read request into a read command, select a PBA corresponding to the LBA, and then provide the read command and the PBA to the memory device 100. When an erase request is received from the host 300 together with the LBA, the memory controller 200 may convert the erase request into an erase command, select a PBA corresponding to the LBA, and then provide the erase command and the PBA to the memory device 100.

In an embodiment, the memory controller 200 may generate and transmit the program command, the address, and the data to the memory device 100 without a request from the host 300. For example, the memory controller 200 may provide the command, the address, and the data to the memory device 100 so as to perform any of various background operations such as a wear leveling program operation and a garbage collection program operation.

In an embodiment, the storage device 50 may further include a buffer memory (not shown). The memory controller 200 may control data exchange between the host 300 and the buffer memory. Alternatively, the memory controller 200 may temporarily store system data for controlling the memory device 100 in the buffer memory. For example, the memory controller 200 may temporarily store data input from the host 300 in the buffer memory, and then transmit data temporarily stored in the buffer memory to the memory device 100.

In various embodiments, the buffer memory may be used as an operation memory and/or a cache memory of the memory controller 200. The buffer memory may store codes or commands executed by the memory controller 200. Alternatively, the buffer memory may store data processed by the memory controller 200.

In an embodiment, the buffer memory may be implemented as a dynamic random access memory (DRAM) such as a double data rate synchronous dynamic random access memory (DDR SDRAM), a DDR4 SDRAM, a low power double data rate4 (LPDDR4) SDRAM, a graphics double data rate (GDDR) SDRAM, a low power DDR (LPDDR), or Rambus dynamic random access memory (DRAM), or a static random access memory (SRAM).

In various embodiments, the buffer memory may be disposed externally and operably coupled to the storage device 50. In this case, externally coupled volatile memory devices may serve as the buffer memory to the storage device 50.

In an embodiment, the memory controller 200 may control two or more memory devices. In this case, the memory controller 200 may control the memory devices according to an interleaving method in order to improve operation performance.

The host 300 may communicate with the storage device 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and/or a load reduced DIMM (LRDIMM).

Figure 2:
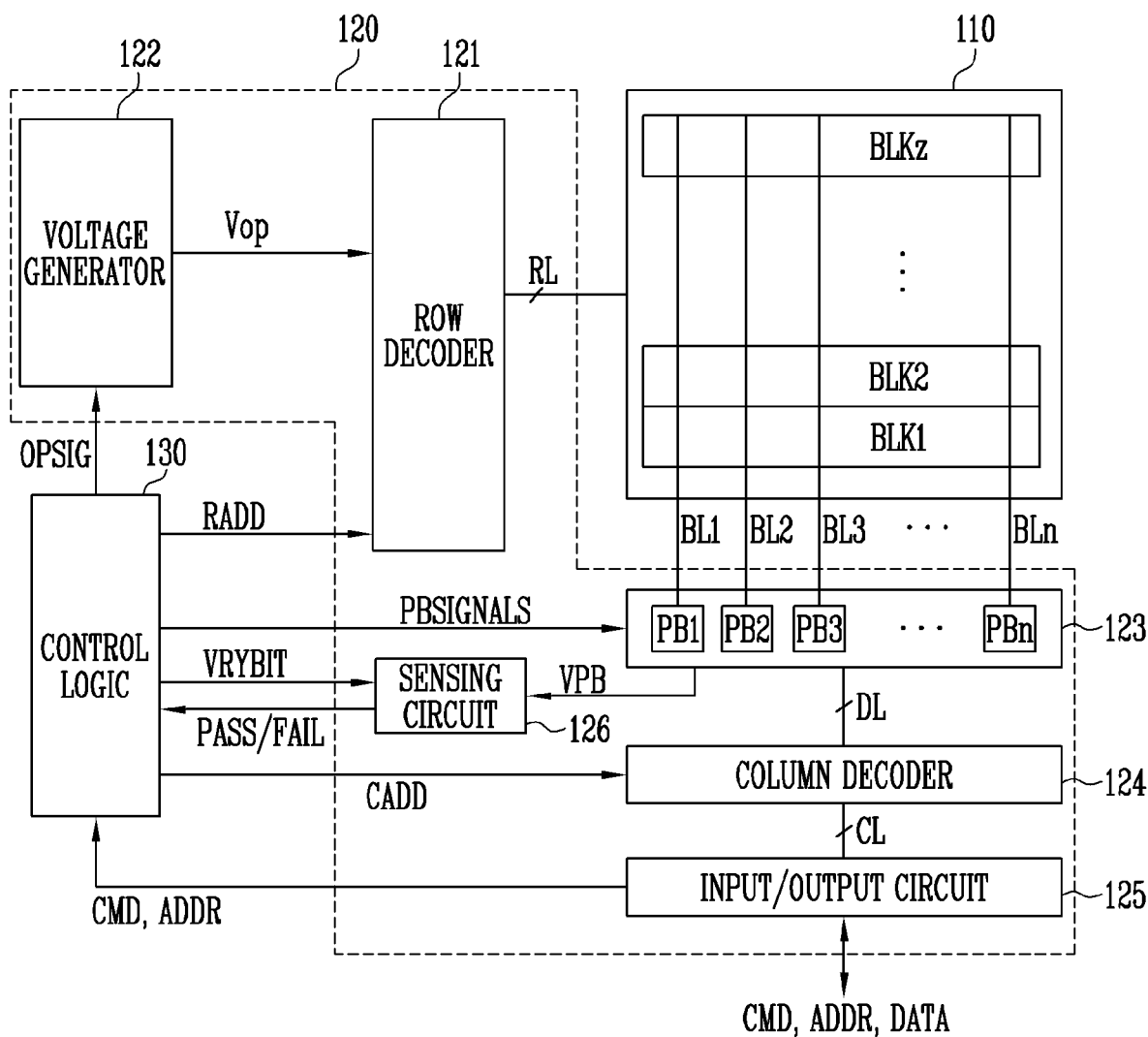
FIG. 2 is diagram illustrating a structure of a memory device, such as that of FIG. 1.

FIG. 2 is diagram illustrating a structure of the memory device of FIG. 1.

Referring to FIG. 2, the memory device 100 may include a memory cell array 110, a peripheral circuit 120, and control logic 130.

The memory cell array 110 includes a plurality of memory blocks BLK1 to BLKz, which are connected to a row decoder 121 through row lines RL. The plurality of memory blocks BLK1 to BLKz may be connected to the page buffer group 123 through bit lines BL1 to BLn. Each of the plurality of memory blocks BLK1 to BLKz includes a plurality of memory cells. In an embodiment, the plurality of memory cells are non-volatile memory cells. Memory cells connected to the same word line may be defined as one page. Therefore, one memory block may include a plurality of pages.

The row lines RL may include at least one source select line, a plurality of word lines, and at least one drain select line.

Each of the memory cells included in the memory cell array 110 may be configured as a single level cell (SLC) that stores one data bit, a multi-level cell (MLC) that stores two data bits, a triple level cell (TLC) that stores three data bits, or a quadruple level cell (QLC) that stores four data bits.

The peripheral circuit 120 may be configured to perform a program operation, a read operation, or an erase operation on a selected region of the memory cell array 110 under control of the control logic 130. The peripheral circuit 120 may drive the memory cell array 110. For example, the peripheral circuit 120 may apply various operation voltages to the row lines RL and the bit lines BL1 to BLn or discharge the applied voltages under the control of the control logic 130.

The peripheral circuit 120 may include a row decoder 121, a voltage generator 122, the page buffer group 123, a column decoder 124, an input/output circuit 125, and a sensing circuit 126.

The row decoder 121 is connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 is configured to decode a row address RADD received from the control logic 130. The row decoder 121 selects at least one memory block among the memory blocks BLK1 to BLKz according to a decoded address. In addition, the row decoder 121 may select at least one word line of the memory block selected to apply the voltages generated by the voltage generator 122 to at least one word line WL according to the decoded address.

For example, during the program operation, the row decoder 121 may apply a program voltage to a selected word line and apply a program pass voltage of a level lower than the program voltage to an unselected word line. During a program verify operation, the row decoder 121 may apply a verify voltage to the selected word line and a verify pass voltage higher than the verify voltage to the unselected word line. During the read operation, the row decoder 121 may apply a read voltage to the selected word line and apply a read pass voltage higher than the read voltage to the unselected word line.

In an embodiment, the erase operation of the memory device 100 is performed in a memory block unit. During the erase operation, the row decoder 121 may select one memory block according to the decoded address. During the erase operation, the row decoder 121 may apply a ground voltage to the word lines connected to the selected memory block.

The voltage generator 122 operates in response to the control of the control logic 130. The voltage generator 122 is configured to generate a plurality of voltages using an external power voltage supplied to the memory device 100. Specifically, the voltage generator 122 may generate various operation voltages Vop used for the program, read, and erase operations, in response to operation signal OPSIG. For example, the voltage generator 122 may generate the program voltage, the verify voltage, the pass voltage, the read voltage, the erase voltage, and the like in response to the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate a plurality of voltages using the external power voltage or the internal power voltage.

For example, the voltage generator 122 may include a plurality of pumping capacitors that receive the internal power voltage, and may selectively activate the plurality of pumping capacitors to generate the plurality of voltages in response to the control of the control logic 130.

The generated plurality of voltages may be supplied to the memory cell array 110 by the row decoder 121.

The page buffer group 123 includes first to n-th page buffers PB1 to PBn, which are connected to the memory cell array 110 through the first to n-th bit lines BL1 to BLn, respectively. The first to n-th page buffers PB1 to PBn operate in response to the control of the control logic 130. Specifically, the first to n-th page buffers PB1 to PBn may operate in response to page buffer control signals PBSIGNALS. For example, the first to n-th page buffers PB1 to PBn may temporarily store data received through the first to n-th bit lines BL1 to BLn, or may sense a voltage or a current of the bit lines BL1 to BLn during the read or verify operation.

Specifically, during the program operation, when the program voltage is applied to the selected word line, the first to n-th page buffers PB1 to PBn may transfer data DATA received through the input/output circuit 125 to the selected memory cell through the first to n-th bit lines BL1 to BLn. The memory cells of the selected page are programmed according to the transferred data DATA. During the program verify operation, the first to n-th page buffers PB1 to PBn may read page data by sensing the voltage or the current received from the selected memory cells through the first to n-th bit lines BL1 to BLn.

During the read operation, the first to n-th page buffers PB1 to PBn read the data DATA from the memory cells of the selected page through the first to n-th bit lines BL1 to BLn, and output the read data DATA to the input/output circuit 125 under the control of the column decoder 124.

During the erase operation, the first to n-th page buffers PB1 to PBn may float the first to n-th bit lines BL1 to BLn or apply the erase voltage.

The column decoder 124 may transfer data between the input/output circuit 125 and the page buffer group 123 in response to a column address CADD. For example, the column decoder 124 may exchange data with the first to n-th page buffers PB1 to PBn through data lines DL, or may exchange data with the input/output circuit 125 through column lines CL.

The input/output circuit 125 may transfer the command CMD and the address ADDR received from the memory controller 200 of FIG. 1 to the control logic 130, or may exchange data DATA with the column decoder 124.

The sensing circuit 126 may generate a reference current in response to a permission bit signal VRYBIT during the read operation or the verify operation, and compare a sensing voltage VPB received from the page buffer group 123 with a reference voltage generated by the reference current to output a pass signal PASS or a fail signal FAIL.

The control logic 130 may output the operation signal OPSIG, the row address RADD, the page buffer control signals PBSIGNALS, and the permission bit VRYBIT in response to the command CMD and the address ADDR to control the peripheral circuit 120. For example, the control logic 130 may control the read operation of the selected memory block in response to a sub block read command and the address. In addition, the control logic 130 may control the erase operation of the selected sub block included in the selected memory block in response to the sub block erase command and the address. In addition, the control logic 130 may determine whether the verity operation has passed or failed in response to the pass or fail signal PASS or FAIL.

Figure 3:
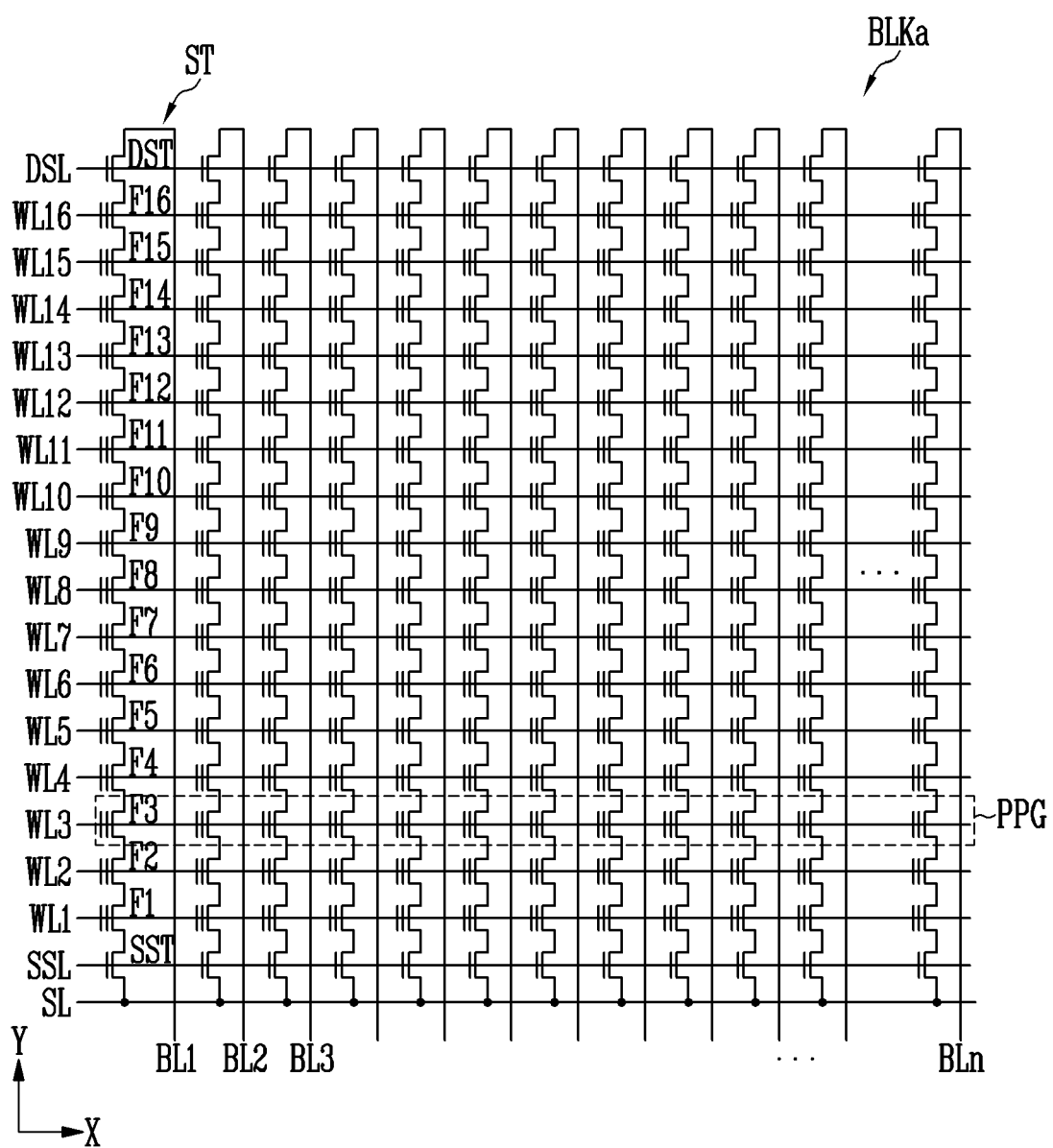
FIG. 3 is a diagram illustrating an embodiment of a memory cell array of FIG. 2.

FIG. 3 is a diagram illustrating an embodiment of the memory cell array of FIG. 2.

FIG. 3 is a circuit diagram showing any one memory block BLKa among the plurality of memory blocks BLK1 to BLKz included in the memory cell array 110 of FIG. 2.

A first select line, word lines, and a second select line arranged in parallel may be connected to the memory block BLKa. For example, the word lines may be arranged in parallel between the first and second select lines. Here, the first select line may be the source select line SSL, and the second select line may be the drain select line DSL.

More specifically, the memory block BLKa may include a plurality of strings connected between the bit lines BL1 to BLn and a source line SL. The bit lines BL1 to BLn may be connected to the strings, respectively, and the source line SL may be commonly connected to the strings. Since each of the strings may be configured the same, a string ST connected to the first bit line BL1 is specifically described, as an example.

The string ST may include a source select transistor SST, a plurality of memory cells F1 to F16, and a drain select transistor DST connected in series between the source line SL and the first bit line BL1. One string ST may include at least one source select transistor SST and drain select transistor DST, and may include more than the sixteen memory cells F1 to F16 shown in the drawing.

A source of the source select transistor SST may be connected to the source line SL and a drain of the drain select transistor DST may be connected to the first bit line BL1. The memory cells F1 to F16 may be connected in series between the source select transistor SST and the drain select transistor DST. Gates of the source select transistors SST included in the different strings may be connected to the source select line SSL, gates of the drain select transistors DST may be connected to the drain select line DSL, and gates of the memory cells F1 to F16 may be connected to a plurality of word lines WL1 to WL16. A group of memory cells connected to the same word line, among memory cells in different strings, may be referred to as a physical page PPG. Therefore, the memory block BLKa may include the same number of physical pages PPG as word lines WL1 to WL16.

One memory cell may store one bit of data. This is commonly referred to as a single level cell (SLC). In this case, one physical page PPG may store one logical page (LPG) data. One logical page (LPG) data may include data bits of the number of memory cells included in one physical page PPG. In addition, one memory cell may store two or more bits of data. This is commonly referred to as a multi-level cell (MLC). In this case, one physical page PPG may store two or more logical page (LPG) data.

A memory cell in which two or more bits of data are stored in one memory cell is generally referred to as a multi-level cell (MLC), but recently, as memory cell capacity has increased, a multi-level cell (MLC) more specifically refers to a memory cell in which two bits of data is stored, in which case a memory cell in which three or more bits of data are stored is referred to as a triple level cell (TLC), and a memory cell in which four or more bits of data are stored is referred to as a quadruple level cell (QLC). In general, the present invention may be applied to memory cells in which two or more bits of data are stored in each memory cell.

Figure 4:
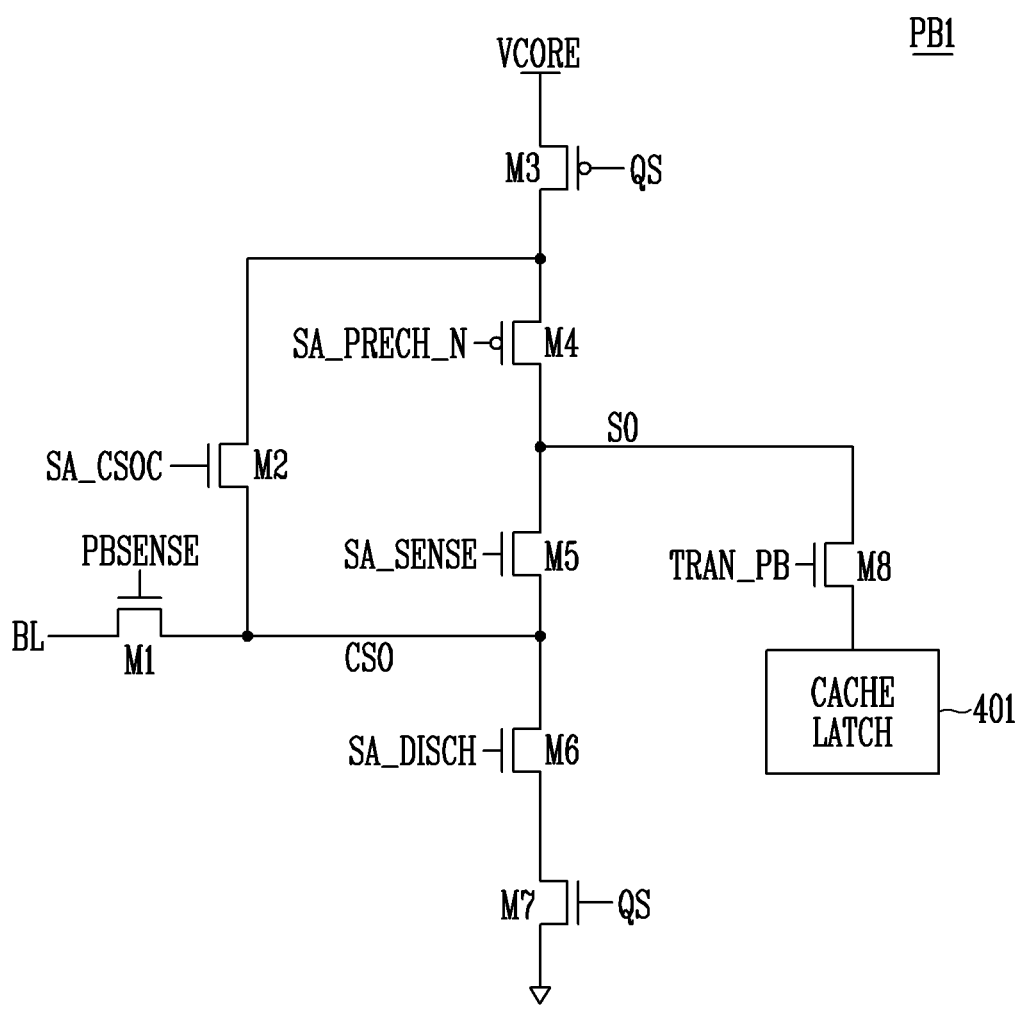
FIG. 4 is a diagram illustrating a portion of any one of a plurality of page buffers included in a page buffer group, such as those of FIG. 2.

FIG. 4 is a diagram illustrating a configuration of any one of the plurality of page buffers included in the page buffer group of FIG. 2.

FIG. 4 illustrates the first page buffer PB1 among the first to n-th page buffers PB1 to PBn included in the page buffer group 123 of FIG. 2. Each of the remaining second to n-th page buffers PB2 to PBn in the page buffer group 123 may also be configured as shown in FIG. 4.

In an embodiment, the first page buffer PB1 may include first to eighth transistors M1 to M8. Among those eight transistors, the third and fourth transistors M3 and M4 may be configured as PMOS transistors and the remaining transistors M1, M2, and M5 to M8 may be configured as NMOS transistors.

The page buffer PB1 is further described in the context of a read operation as an example.

Referring to FIG. 4, during the read operation, the first page buffer PB1 may be connected to a memory cell MC through a bit line BL, and may perform a bit line precharge operation of charging a charge supplied from a power voltage VCORE to the bit line BL through the first to fifth transistors M1 to M5.

The first transistor M1 is controlled by a first sense signal PBSENSE, a second transistor M2 is controlled by a first precharge signal SA_CSOC, and the third transistor M3 is controlled by a data signal QS. In addition, the fourth transistor M4 is controlled by a second precharge signal SA_PRECH_N, and the fifth transistor M5 is controlled by a second sense signal SA_SENSE. That is, the first to fifth transistors M1 to M5 may be may be turned on or off by the first sense signal PBSENSE, the first precharge signal SA_CSOC, the data signal QS, the second precharge signal SA_PRECH_N, and the second sense signal SA_SENSE, respectively.

In addition, the first page buffer PB1 may discharge the charge on the bit line BL through the first transistor M1, the sixth transistor M6, and the seventh transistor M7 to a ground voltage. The sixth transistor M6 is controlled by a first discharge signal SA_DISCH, and the seventh transistor M7 is controlled by the data signal QS.

During a sensing operation performed on the memory cell MC, a voltage of a sensing node SO is based on a threshold voltage of the memory cell MC.

For example, a voltage of the bit line BL may be based on the threshold voltage of the memory cell MC. When the first and fifth transistors M1 and M5 are turned on, since the bit line BL and the sensing node SO are connected to each other through a common node CSO, the voltage of the sensing node SO may be based on the threshold voltage of the memory cell MC.

In addition, when the eighth transistor M8 is turned on, data may be temporarily stored in a cache latch 401 based on the voltage of the sensing node SO. Here, the eighth transistor M8 may be turned on or off by a third sense signal TRAN_PB. The data stored in the cache latch 401 may be output to the outside.

Figure 5A:
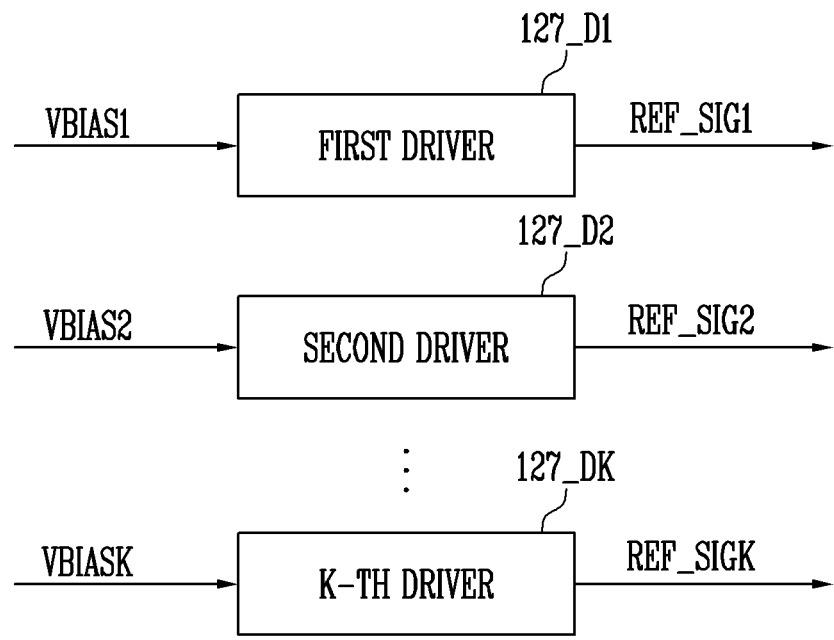
FIGS. 5A and 5B are diagrams illustrating a merged driver.
Figure 5B:
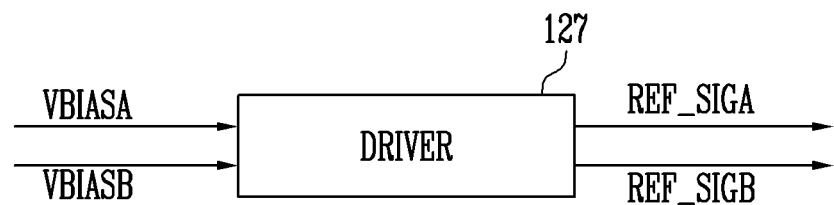

FIGS. 5A and 5B are diagrams illustrating a merged driver.

Referring to FIGS. 5A and 5B, FIG. 5A illustrates a method in which the signals to be applied to the page buffer are generated through a plurality of drivers, and FIG. 5B illustrates a method in which the signals to be applied to the page buffer are generated through one driver, that is, the merged driver.

In an embodiment, signals applied to the first to eighth transistors M1 to M8 in the first page buffer PB1 of FIG. 4 may be required to satisfy separate characteristics, respectively.

For example, a magnitude of the signal may need to be increased within a specific time, the magnitude of the signal may need to be prevented from decreasing, or a fast recovery of a reduced magnitude signal may be required. In another embodiment, characteristics required for each signal may vary.

FIG. 5A illustrates first to K-th drivers 127_D1 to 127_DK that generate the signals for satisfying characteristics required for each of the signals applied to the first to eighth transistors M1 to M8 in the page buffer PB1 of FIG. 4. In an embodiment, K is a natural number less than or equal to the number of signals applied to the page buffer PB1 of FIG. 4.

In an embodiment, first to K-th bias voltages VBIAS1 to VBIASK may be applied to the first to K-th drivers, respectively. Some of the first to K-th bias voltages may have the same level, or all of the first to K-th bias voltages VBIAS1 to VBIASK may have different levels.

When the first to K-th bias voltages VBIAS1 to VBIASK are applied to the respective drivers, the first to K-th drivers 127_D1 to 127_DK may generate first to K-th reference signals REF_SIG1 to REF_SIGK in consideration of the characteristics of each signal.

However, as the memory device 100 of FIG. 1 is miniaturized, or as a larger number of chips are included in the memory device 100 of FIG. 1, less space may be available for the drivers, and thus the first to K-th drivers 127_D1 to 127_DK may be implemented as a merged structure.

Referring to FIG. 5B, the first to K-th drivers 127_D1 to 127_DK may be configured as one driver 127. Alternatively, some of the first to K-th drivers 127_D1 to 127_DK may be configured as one driver 127, while the remaining drivers are implemented individually.

In FIG. 5B, an A-th bias voltage VBIASA and/or a B-th bias voltage VBIASB may be applied to the driver 127, and the driver 127 may generate an A-th reference signal REF_SIGA and/or a B-th reference signal REF_SIGB based on the applied bias voltage(s). Here, a plurality of signals may be generated through one bias voltage, or a plurality of reference signals may be generated based on the plurality of bias voltages.

As a result, when one or both of the bias voltages are applied to the single driver 127, the driver 127 may generate signals satisfying the characteristic of each signal to be generated based on the applied voltage.

The level of the bias voltage input to the driver may vary based on the specific components used, and the same is true for signal output from the driver.

However, since all signals are to be generated through one driver 127, each signal generated may not have its required characteristic. Therefore, the current flowing through the driver, the magnitude of the load of the output terminal of the driver, and the magnitude of the capacitance are controlled in order to generate each signal with its appropriate characteristic.

Figure 6A:
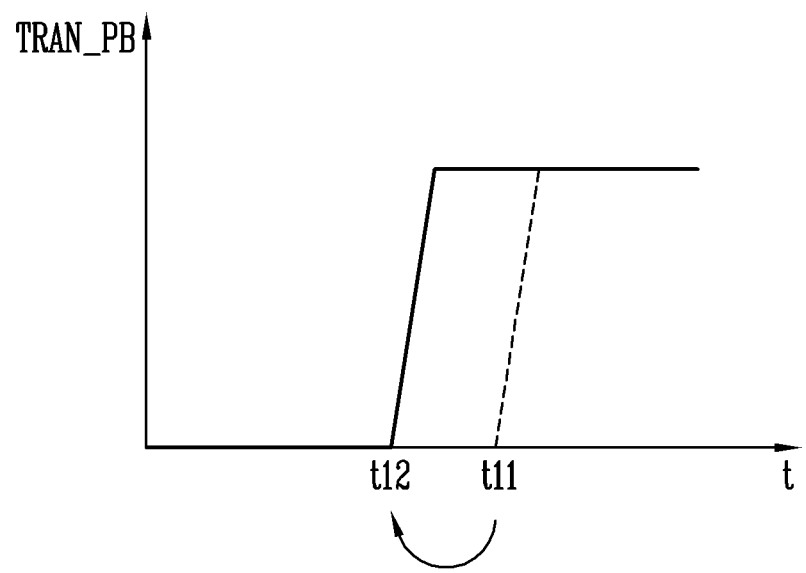
FIGS. 6A and 6B are diagrams illustrating characteristics for different signals applied to the page buffer.
Figure 6B:
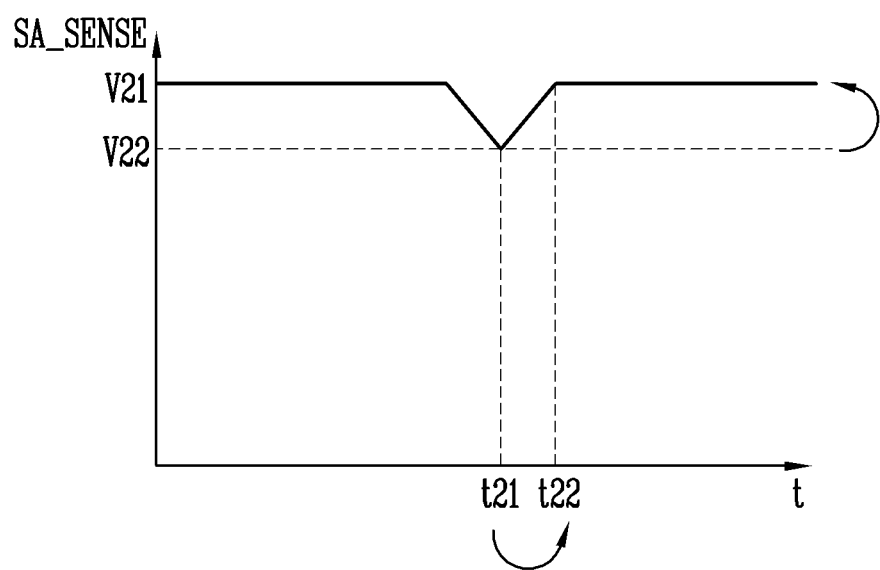

FIGS. 6A and 6B are diagrams illustrating characteristics required for different signals applied to the page buffer.

FIG. 6A illustrates a characteristic required for the third sense signal TRAN_PB applied to a gate of the eighth transistor M8 of FIG. 4, and FIG. 6B illustrates a characteristic required for the second sense signal SA_SENSE applied to a gate of the fifth transistor M5 of FIG. 4.

In another embodiment, each of the signals applied to other transistors of FIG. 4 may also be required to satisfy a specific requirement.

In FIGS. 6A and 6B, it is assumed that the third sense signal TRAN_PB and the second sense signal SA_SENSE are generated through one driver.

In FIG. 6A, the third sense signal TRAN_PB may be required to be increased within a specific time. For example, since the third sense signal TRAN_PB generated through the merged driver is supposed to reach a certain level at t11, it may be necessary to start increasing TRAN_PB at t12, before t11.

In FIG. 6B, after the second sense signal SA_SENSE is generated and maintained at a specific level, the level of the second sense signal SA_SENSE may be decreased. As a result, rapidly recovering the reduced level or minimizing the decrease of the level of the second sense signal SA_SENSE may be required. For example, when the level decreased to V22 at t21 is increased to V21 again at t22, that the time difference between t22 and t21 should be relatively short.

Therefore, in the present disclosure, a merged driver is provided that may be implemented in a relatively small space and also generates signals that satisfy their required characteristics respectively.

Figure 7:
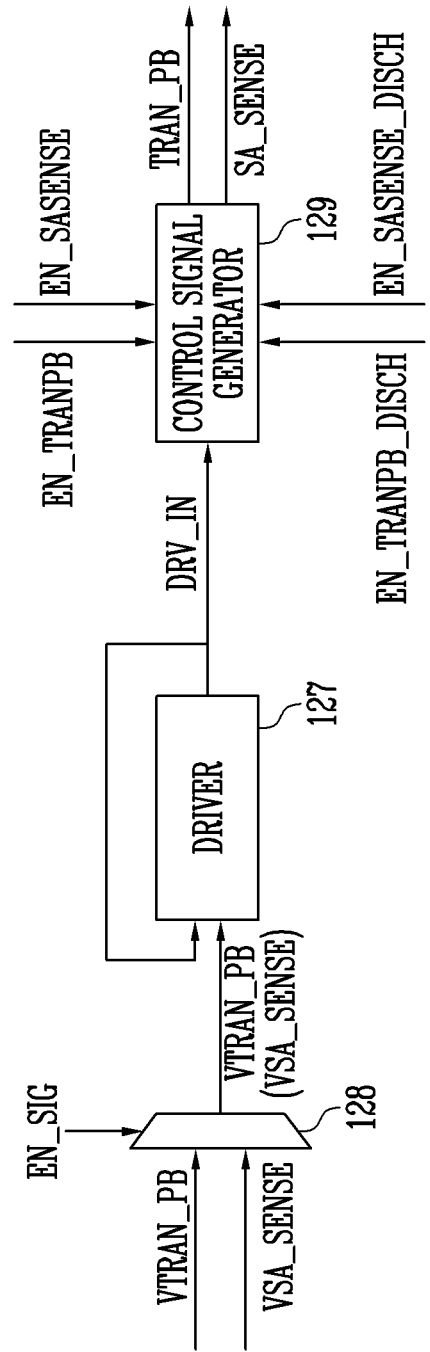
FIG. 7 is a diagram illustrating a process of generating a control signal applied to a page buffer in the combination of a merge driver, the multiplexer and the control signal generator.

FIG. 7 is a diagram illustrating a process of generating a control signal applied to the page buffer in the combination of the merged driver, the multiplexer and the control signal generator.

FIG. 7 illustrates a configuration included in the memory device 100 of FIG. 1 to generate the second sense signal SA_SENSE and the third sense signal TRAN_PB. In an embodiment, the memory device 100 of FIG. 1 may include the driver 127, a multiplexer 128, and a control signal generator 129 to generate the signals applied to the page buffer.

In an embodiment, a second sense voltage VSA_SENSE and a third sense voltage VTRAN_PB may be applied to the multiplexer 128. The second sense signal SA_SENSE may be generated based on the second sense voltage VSA_SENSE and the third sense signal TRAN_PB may be generated based on the third sense voltage VTRAN_PB.

When two signals are input to the multiplexer 128, a voltage to be input to the driver 127 may be determined according to an enable signal EN_SIG. For example, when the enable signal EN_SIG of a low state is input to the multiplexer 128, the second sense voltage VSA_SENSE may be provided as an input of the driver 127, and when the enable signal EN_SIG of a high state is input to the multiplexer 128, the third sense voltage VTRAN_PB may be provided as the input of the driver 127.

When any one of the second sense voltage VSA_SENSE and the third sense voltage VTRAN_PB is determined according to the enable signal EN_SIG, the determined voltage is provided as the input of the driver 127. The driver 127 may generate a drive input signal DRV_IN based on the input voltage (VTRAN_PB or VSA_SENSE) and a feedback voltage. The driver 127 may output the drive input signal DRV_IN to the control signal generator 129.

The control signal generator 129 may generate the second sense signal SA_SENSE and the third sense signal TRAN_PB based on the drive input signal DRV_IN output from the driver 127, a second sense enable signal EN_SASENSE, a third sense enable signal EN_TRANPB, a second sense discharge signal EN_SASENSE_DISCH, and the third sense discharge signal EN_TRANPB_DISCH, and may output the generated signals to the page buffer. In an embodiment, the second sense enable signal EN_SASENSE, the third sense enable signal EN_TRANPB, the second sense discharge signal EN_SASENSE_DISCH, and the third sense discharge signal EN_TRANPB_DISCH may be generated by a enable signal generator (not shown).

Figure 8:
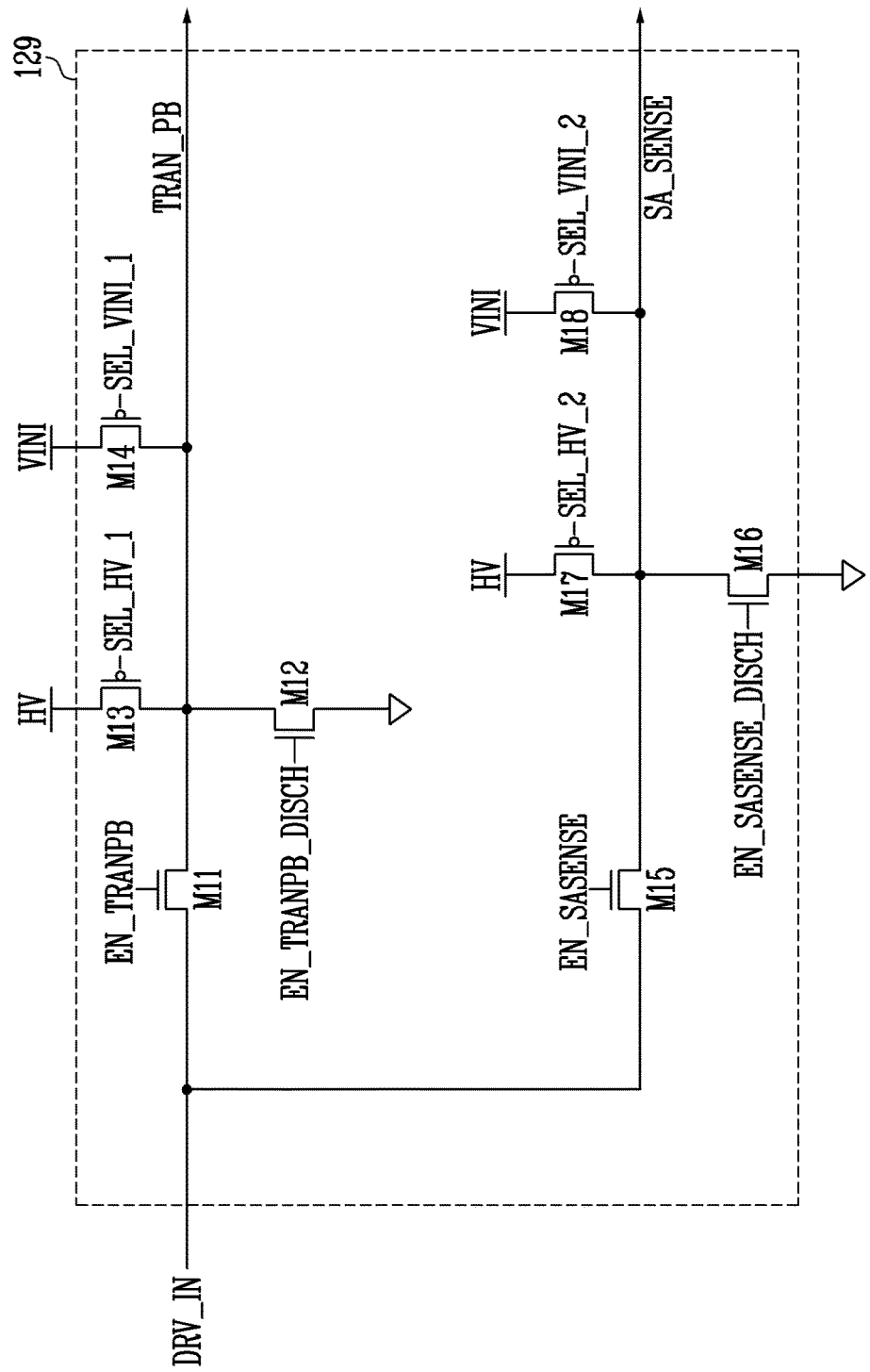
FIG. 8 is a diagram illustrating a structure of a control signal generator, such as that of FIG. 7.

FIG. 8 is a diagram illustrating a structure of the control signal generator of FIG. 7.

Referring to FIGS. 7 and 8, the control signal generator 129 may include eleventh to eighteenth transistors M11 to M18. The eleventh, twelfth, fifteenth, and sixteenth transistors M11, M12, M15, and M16 may be configured as NMOS transistors, and the remaining transistors M13, M14, M17, and M18 may be configured as PMOS transistors.

In addition, the second sense enable signal EN_SASENSE may be applied to a gate of the fifteenth transistor M15, the third sense enable signal EN_TRANPB may be applied to a gate of the eleventh transistor M11, the second sense discharge signal EN_SASENSE_DISCH may be applied to a gate of the sixteenth transistor M16, and the third sense discharge signal EN_TRANPB_DISCH may be applied to a gate of the twelfth transistor M12. The second sense discharge signal EN_SASENSE_DISCH and the third sense discharge signal EN_TRANPB_DISCH may be signals for discharging the drive input signal DRV_IN.

Furthermore, a first high voltage select signal SEL_HV_1 of FIG. 8 may be applied to a gate of the thirteenth transistor M13, a first start voltage select signal SEL_VINI_1 may be applied to a gate of the fourteenth transistor M14, a second high voltage select signal SEL_HV_2 may be applied to a gate of the seventeenth transistor M17, and a second start voltage select signal SEL_VINI_2 may be applied to a gate of the eighteenth transistor M18. In an embodiment, the first high voltage select signal SEL_HV_1, the first start voltage select signal SEL_VINI_1, the second high voltage select signal SEL_HV_2, the second start voltage select signal SEL_VINI_2 may be generated by a enable signal generator (not shown).

In an embodiment, the control signal generator 129 may generate control signals based on the drive input signal output from the driver. For example, the control signal generator 129 may generate any one of the second sense signal SA_SENSE and the third sense signal TRAN_PB, based on the drive input signal output from the driver, and output the generated signal to the page buffer.

For example, the third sense signal TRAN_PB may be generated based on the drive input signal DRV_IN, the third sense enable signal EN_TRANPB, and the third sense discharge signal EN_TRANPB_DISCH applied to the control signal generator 129. When the third sense signal TRAN_PB is generated, due to a characteristic required for the third sense signal TRAN_PB, the eleventh to fourteenth transistors M11 to M14 may be turned on or turned off.

In addition, when the third sense signal TRAN_PB is generated, as the thirteenth transistor M13 and/or the fourteenth transistor M14 are/is turned on or turned off based on the first high voltage select signal SEL_HV_1 and the first start voltage select signal SEL_VINI_1, a potential of a node connecting the eleventh to fourteenth transistors M11 to M14 may be determined.

For example, the second sense signal SA_SENSE may be generated based on the drive input signal DRV_IN, the second sense enable signal EN_SASENSE, and the second sense discharge signal EN_SASENSE_DISCH applied to the control signal generator 129. When the second sense signal SA_SENSE is generated, due to a characteristic required for the second sense signal SA_SENSE, the fifteenth to eighteenth transistors M15 to M18 may be turned on or turned off.

In addition, when the second sense signal SA_SENSE is generated, as the seventeenth transistor M17 and/or the eighteenth transistor M18 are/is turned on or turned off based on the second high voltage select signal SEL_HV_2 and the second start voltage select signal SEL_VINI_2, a potential of a node connecting the fifteenth to eighteenth transistors M15 to M18 may be determined.

Figure 9:
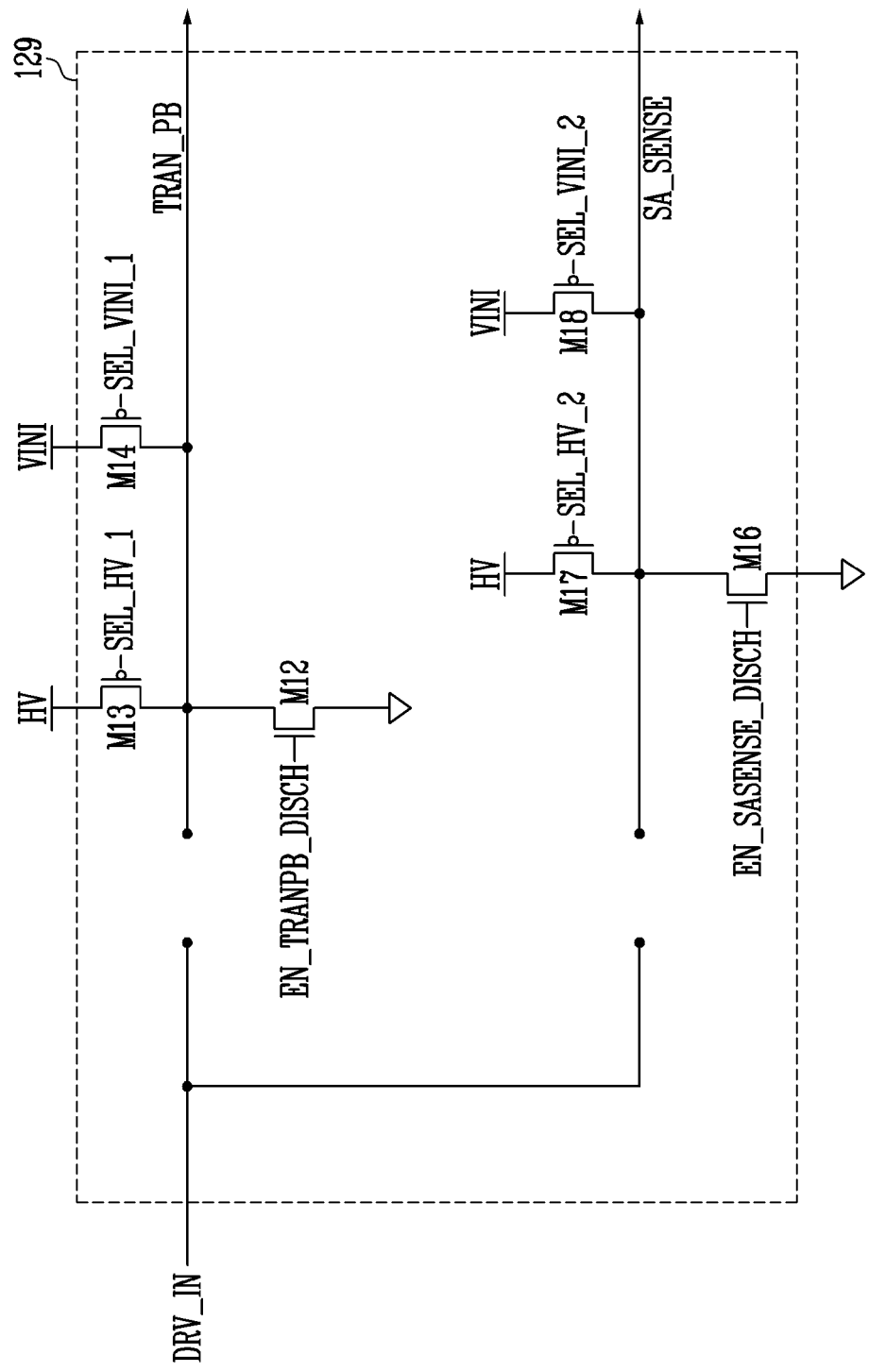
FIG. 9 illustrates an operation of a control signal generator when the driver operates before a sense signal TRAN_PB is generated.

FIG. 9 illustrates an operation of the control signal generator when only the driver operates before the TRAN_PB signal is generated.

FIG. 9 is a diagram illustrating a configuration of the control signal generator 129 of FIG. 8 when generating the third sense signal TRAN_PB.

In an embodiment, the third sense signal TRAN_PB may need to be increased within a specific time. For example, the third sense signal TRAN_PB may be required to be increased within 200 nS.

Therefore, in order to increase the third sense signal TRAN_PB within the specific time, only the driver 127 of FIG. 7 may be first operated before the control signal generator 129 operates, and thereafter, an operation for generating the third sense signal TRAN_PB may be performed.

Referring to FIG. 9, in an embodiment, before generating the third sense signal TRAN_PB, only the driver 127 of FIG. 7 may be operated. In this case, in the control signal generator 129, the eleventh and fifteenth transistors M11 and M15 may be turned off based on the third sense enable signal EN_TRANPB of a low state applied to the gate of the eleventh transistor M11 and the second sense enable signal EN_SASENSE of a low state applied to the gate of the fifteenth transistor M15.

Therefore, as the eleventh and fifteenth transistors M11 and M15 are turned off, the magnitude of the load viewed from the output terminal of the driver 127 of FIG. 7 may decrease to a relatively light load. Thus, the load of the output terminal of the driver 127 of FIG. 7 is reduced, and the current flowing through the entire driver 127 of FIG. 7 is reduced.

Figure 10:
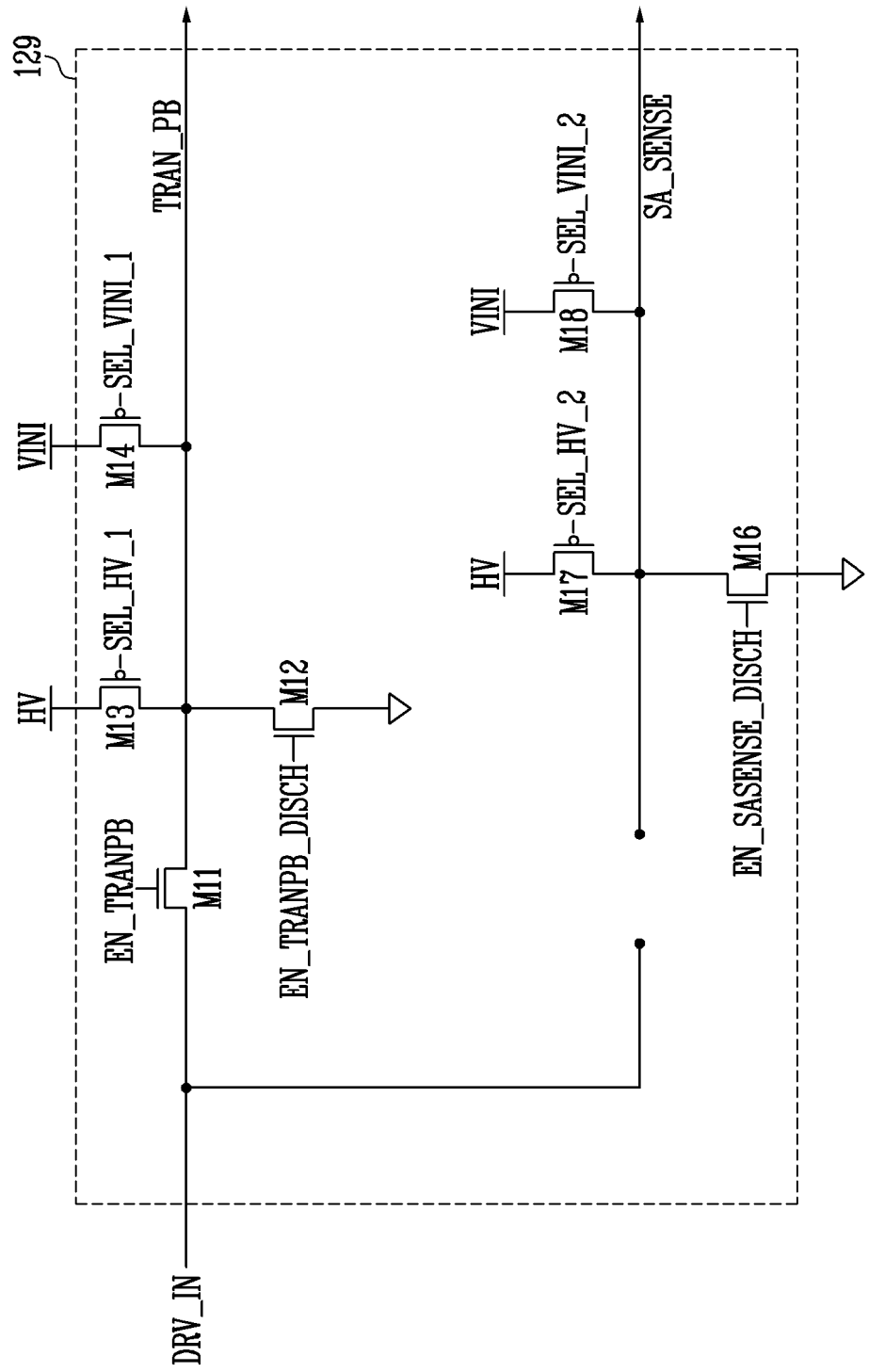
FIG. 10 illustrates operation of a control signal generator when a TRAN_PB signal is generated.

FIG. 10 illustrates the operation of the control signal generator when the TRAN_PB signal is generated.

Referring to FIGS. 9 and 10, FIG. 10 illustrates a process in which the third sense signal TRAN_PB is generated by the control signal generator 129 after the driver 127 of FIG. 7 operates as in FIG. 9.

In an embodiment, the control signal generator 129 may generate control signals based on the drive input signal output from the driver. For example, in order to generate the third sense signal TRAN_PB, the third sense enable signal EN_TRANPB of a high state may be applied to the gate of the eleventh transistor M11, and the eleventh transistor M11 may be turned on.

As the eleventh transistor M11 is turned on, the magnitude of the load viewed from the output terminal of the driver 127 may increase to a relatively heavy load. That is, as the driver 127 and the control signal generator 129 are connected, the load of the output terminal of the driver 127 may increase.

Therefore, the load of the output terminal of the driver 127 is increased, and the current flowing through the driver 127 is increased.

Furthermore, in order to generate the third sense signal TRAN_PB, the thirteenth transistor M13 and the fourteenth transistor M14 are selectively turned on based on the first high voltage select signal SEL_HV_1 and the first start voltage select signal SEL_VINI_1, a potential of a node connecting the eleventh to fourteenth transistors M11 to M14 for generating the third sense signal TRAN_PB may be determined.

Figure 11:
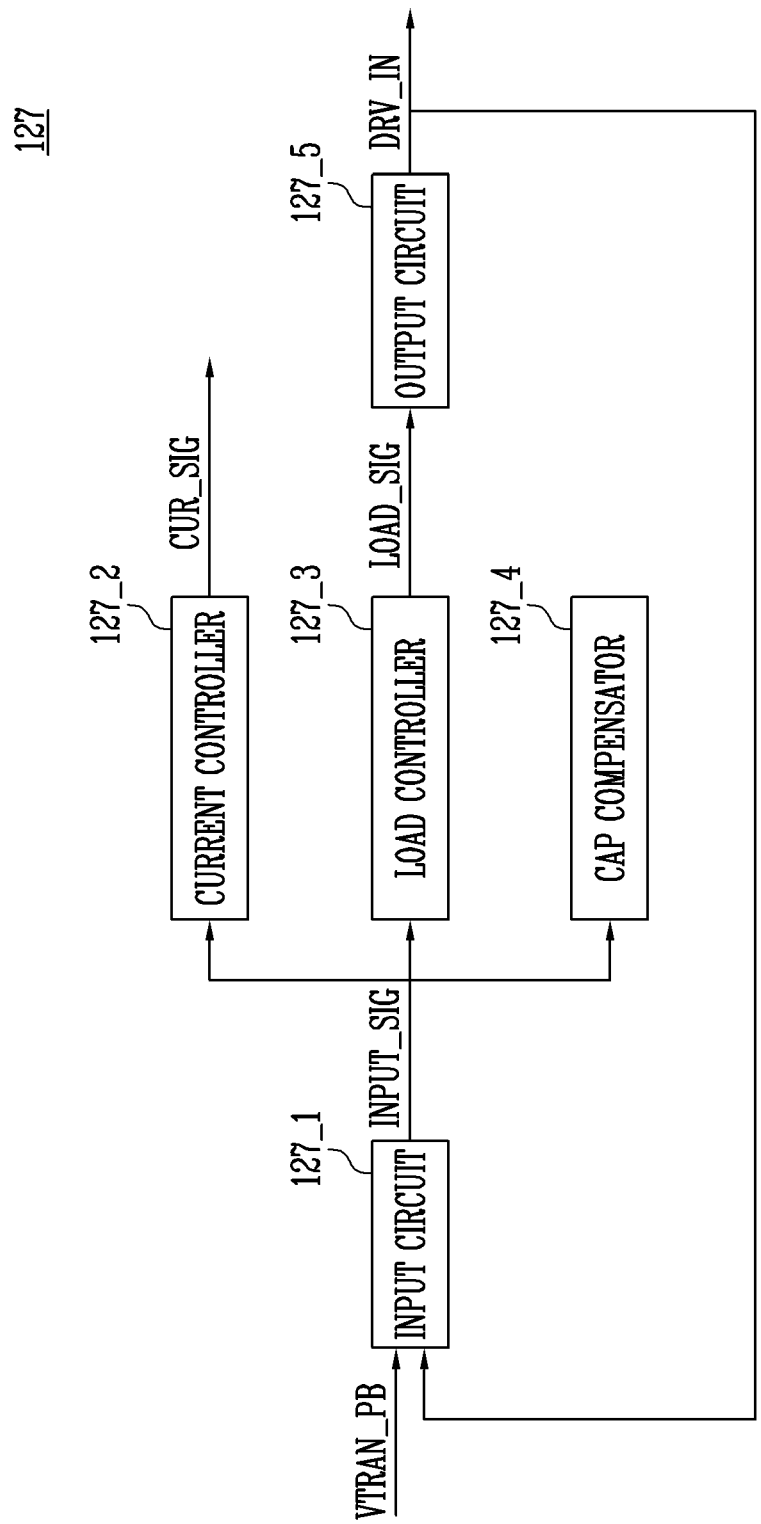
FIG. 11 illustrates operation of a driver for satisfying a characteristic of the TRAN_PB signal.

FIG. 11 illustrates the operation of the driver to generate the TRAN_PB signal with its required characteristic.

Referring to FIG. 11, the driver 127 may include an input circuit 127_1, a current controller 127_2, a load controller 127_3, a capacitor (cap) compensator 127_4, and an output circuit 127_5. The input circuit 127_1 may receive a voltage selected from the multiplexer 128 of FIG. 7 and a feedback voltage and output an input signal. The feedback voltage may be the drive input signal DRV_IN input to the control signal generator 129 of FIG. 7. The current controller 127_2 may control the current flowing through the driver 127, and the load controller 127_3 and the cap compensator 127_4 may control the load of the output circuit 127_5. The load controller 127_3 may control a magnitude of a load of an output terminal of the driver 127 for controlling a load of the output circuit 127_5.

In an embodiment, the output circuit 127_5 may output the drive input signal DRV_IN for controlling to generate the third sense signal TRAN_PB to be applied to the page buffer.

The input circuit 127_1, the current controller 127_2, the load controller 127_3, the cap compensator 127_4, and the output circuit 127_5 may include components such as a transistor, a resistor, and a capacitor.

In FIG. 11, it is assumed that the generated signal is the third sense signal TRAN_PB. Therefore, the voltage selected from the multiplexer 128 may be the third sense voltage VTRAN_PB, and the third sense voltage VTRAN_PB may be input to the input circuit 127_1 together with the feedback voltage DRV_IN. The input circuit 127_1 may output the input signal INPUT_SIG for generating the third sense signal TRAN_PB. Namely, the input circuit 127_1 may output the third sense voltage VTRAN_PB as the input signal INPUT_SIG.

Referring to FIGS. 9 to 11, the third sense signal TRAN_PB is required to be increased within a specific time. Initially, only the driver 127 may operate, and then the driver 127 and the control signal generator 129 may operate together.

In an embodiment, before the control signal generator 129 operates, the load of the output terminal of the driver 127 is reduced and the current flowing through the driver 127 is reduced, so that the third sense signal TRAN_PB is increased within the specific time. That is, when only the driver 127 is operated, since the load of the output terminal of the driver 127 is reduced, the current flowing through the driver 127 is reduced.

Therefore, before the control signal generator 129 operates, the driver 127 may perform an operation for reducing the load of the output terminal of the driver 127 and controlling the current flowing through the driver 127.

Specifically, the current controller 127_2 may output a current signal CUR_SIG for reducing the current flowing through the entire driver 127, based on the input signal INPUT_SIG for generating the third sense signal TRAN_PB. At this time, the current signal CUR_SIG may be in a low state.

In addition, the load controller 127_3 may output a load signal LOAD_SIG for reducing the load of the output circuit 127_5. At this time, the load signal LOAD_SIG may be in a low state.

In an embodiment, the cap compensator 127_4 may increase a capacitance of a load of an output terminal. However, the cap compensator 127_4 may not operate even though the cap compensator 127_4 receives the input signal INPUT_SIG for generating the third sense signal TRAN_PB.

Thereafter, in an embodiment, the load of the output terminal of the driver 127 is increased and the current flowing through the entire driver 127 is increased, so that the third sense signal TRAN_PB is increased within a specific time after the control signal generator 129 operates.

Specifically, the current controller 127_2 may output the current signal CUR_SIG for increasing the current flowing through the entire driver 127, based on the input signal INPUT_SIG for generating the third sense signal TRAN_PB. To do so, the current signal CUR_SIG may be in a high state.

In addition, the load controller 127_3 may output the load signal LOAD_SIG for increasing the load of the output circuit 127_5. To do so, the load signal LOAD_SIG may be in a high state.

Figure 12A:
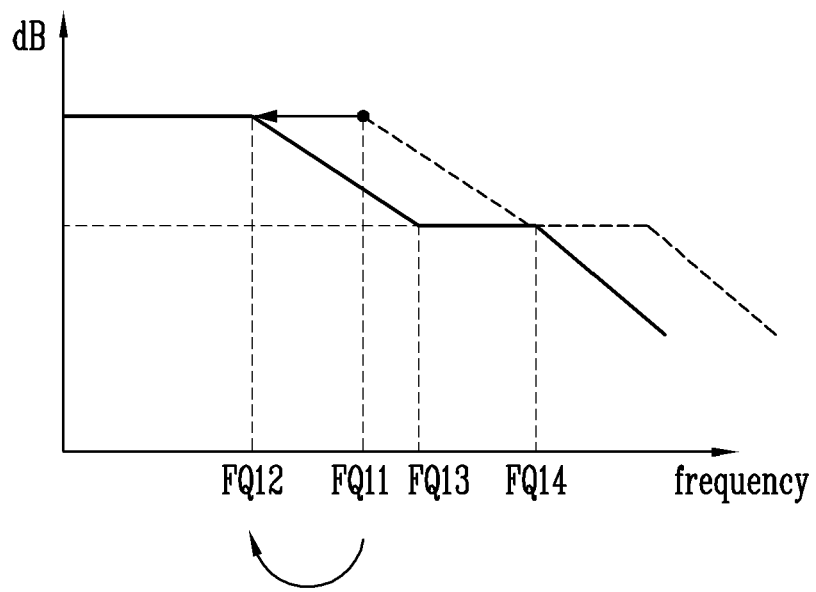
FIGS. 12A and 12B illustrate an AC characteristic when the TRAN_PB signal is generated.
Figure 12B:
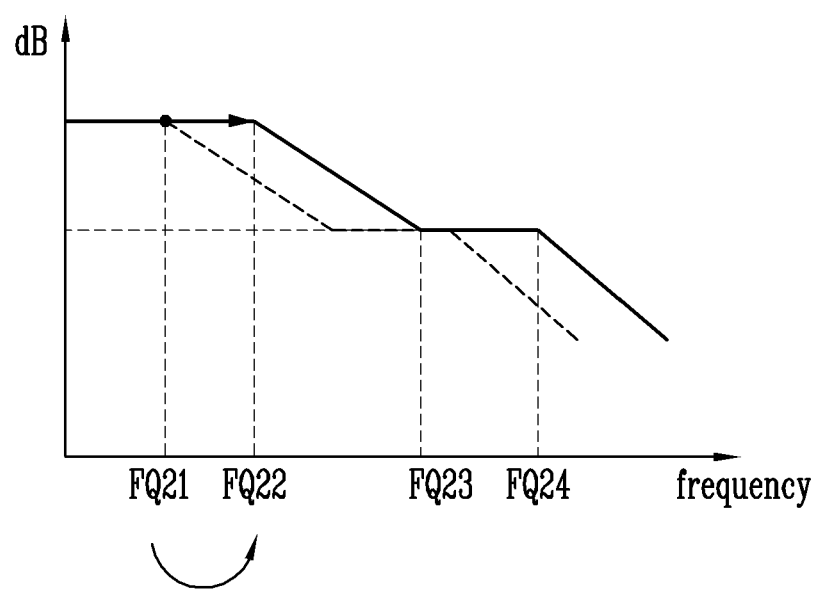

FIGS. 12A and 12B illustrate an AC characteristic of the TRAN_PB signal when it is generated.

Referring to FIGS. 12A and 12B, FIG. 12A illustrates the AC characteristic of the TRAN_PB signal generated when the magnitude of the load viewed from the output terminal of the driver 127 is small, and FIG. 12B illustrates the AC characteristic of the TRAN_PB signal generated when the magnitude of the load viewed from the output terminal of the driver 127 is large.

In FIGS. 12A and 12B, the horizontal axis represents the frequency of the TRAN_PB signal, and the vertical axis represents the voltage magnitude ratio (dB). For example, when a voltage magnitude ratio is one time, the voltage magnitude ratio may be 0 dB, when the voltage magnitude ratio is two times, the voltage magnitude ratio may be 6 dB, when the voltage magnitude ratio is 3 times, the voltage magnitude ratio may be 10 dB, and when the voltage magnitude ratio is 10 times, the voltage magnitude ratio may be 20 dB.

In an embodiment, referring to FIG. 12A, when the magnitude of the load viewed from the output terminal of the driver 127 is small, stability is secured by generating a signal of a high frequency and generating a signal of a low frequency. At this time, since the magnitude of the load is small, there is no need to generate a signal having a large bandwidth.

Therefore, when the magnitude of the load viewed from the output terminal of the driver 127 is small, the driver 127 of FIG. 7 may reduce the load of the output terminal and reduce the current flowing through the driver 127. When the load of the output terminal of the driver 127 is reduced, the TRAN_PB signal of a low frequency may be generated.

For example, the TRAN_PB signal having a frequency of FQ11 may be changed to a frequency of FQ12 and generated. The TRAN_PB may also be changed to a low frequency of FQ13 or FQ14.

In an embodiment, referring to FIG. 12B, when the magnitude of the load viewed from the output terminal of the driver 127 is large, high speed is obtained by generating a signal of a low frequency and generating a signal of a high frequency instead of a signal of a low frequency. That is, since the signal is generated at a low frequency, stability of the signal is high, but the frequency may be increased for high operation speed.

Therefore, when the magnitude of the load viewed from the output terminal of the driver 127 is large, the driver 127 may increase the load of the output terminal and increase the current flowing through the driver 127. When the load of the output terminal of the driver 127 is increased, the TRAN_PB signal of a high frequency may be generated.

For example, the TRAN_PB signal having a frequency of FQ21 may be changed to a frequency of FQ22 and generated. The TRAN_PB may also be changed to a high frequency of FQ23 or FQ24.

Figure 13:
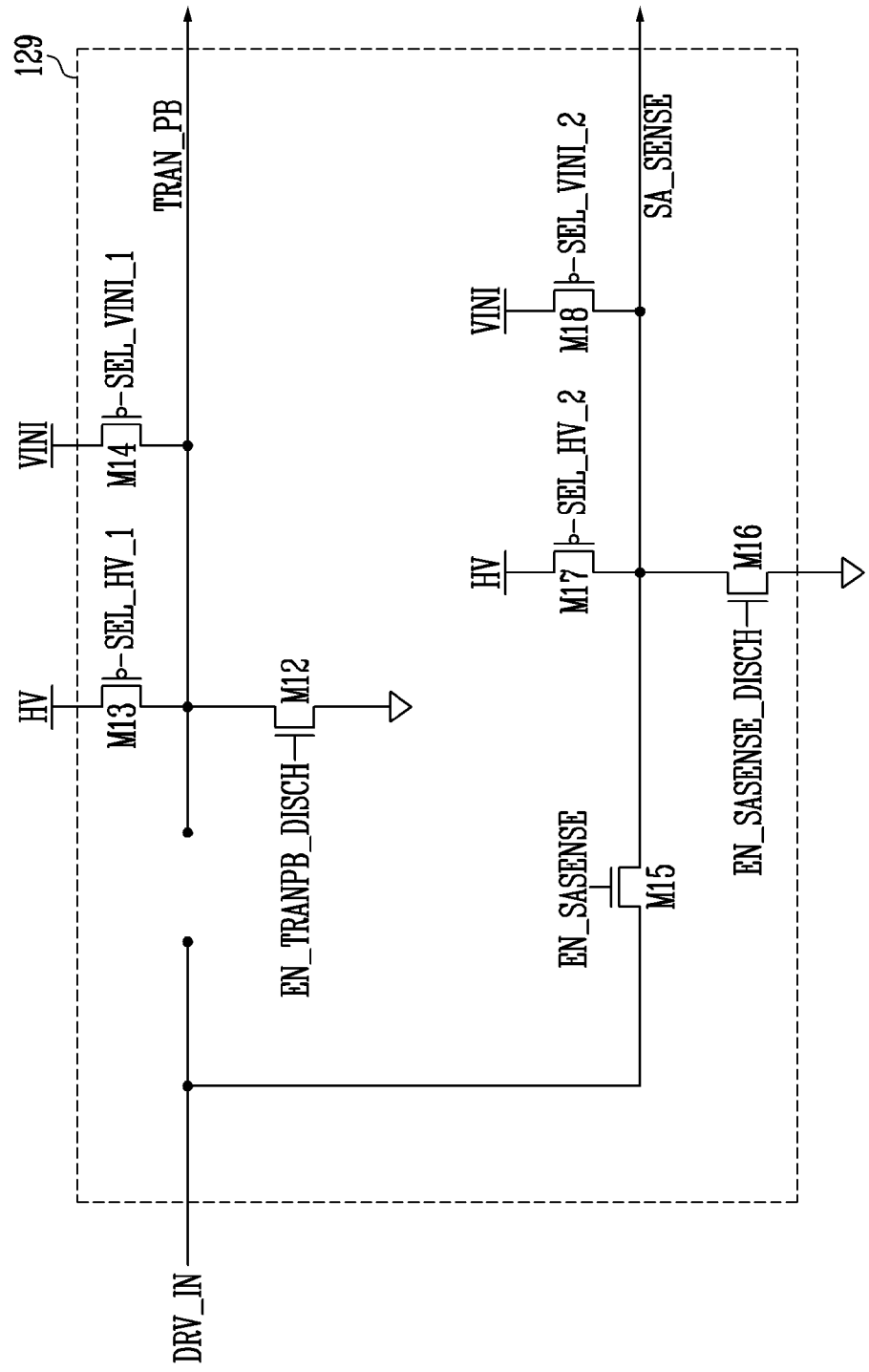
FIG. 13 illustrates operation of a control signal generator when a sense signal SA_SENSE is generated.

FIG. 13 illustrates the operation of the control signal generator when the SA_SENSE signal is generated.

Referring to FIGS. 8 and 13, FIG. 13 illustrates a process in which the second sense signal SA_SENSE is generated by the control signal generator 129 when the driver 127 operates. When the voltage output from the multiplexer 128 is the second sense voltage VSA_SENSE corresponding to the second sense signal SA_SENSE, the operation of the driver 127 and the control signal generator 129 may be started simultaneously.

In an embodiment, the control signal generator 129 may generate control signals based on the drive input signal output from the driver.

In an embodiment, it may be required to prevent the second sense signal SA_SENSE from decreasing to a voltage of a specific level within a specific time or it may be required to rapidly recover the voltage of SA_SENSE back to its pre-drop level. For example, the second sense signal SA_SENSE may be generated and maintained at a specific level, or when the level of SA_SENSE drops, it may be rapidly increased (recovered) to its pre-drop level.

Therefore, an operation for preventing the decrease of the level of the second sense signal SA_SENSE or rapidly recovering the decreased level to its pre-decrease level may be performed.

In an embodiment, in order to generate the second sense signal SA_SENSE, the second sense enable signal EN_SA-SENSE of a high state may be applied to the gate of the fifteenth transistor M15, and the fifteenth transistor M15 may be turned on.

As the fifteenth transistor M15 is turned on, the magnitude of the load viewed from the output terminal of the driver 127 may increase (heavy load). Therefore, the load of the output terminal of the driver 127 is increased, and the current flowing through the entire driver 127 is increased.

In an embodiment, in order to generate the second sense signal SA_SENSE, as the seventeenth transistor M17 and the eighteenth transistor M18 are selectively turned on based on the second high voltage select signal SEL_HV_2 and the second start voltage select signal SEL_VINI_2, a potential of a node connecting the fifteenth to eighteenth transistors M15 to M18 for generating the second sense signal SA_SENSE may be determined.

Figure 14:
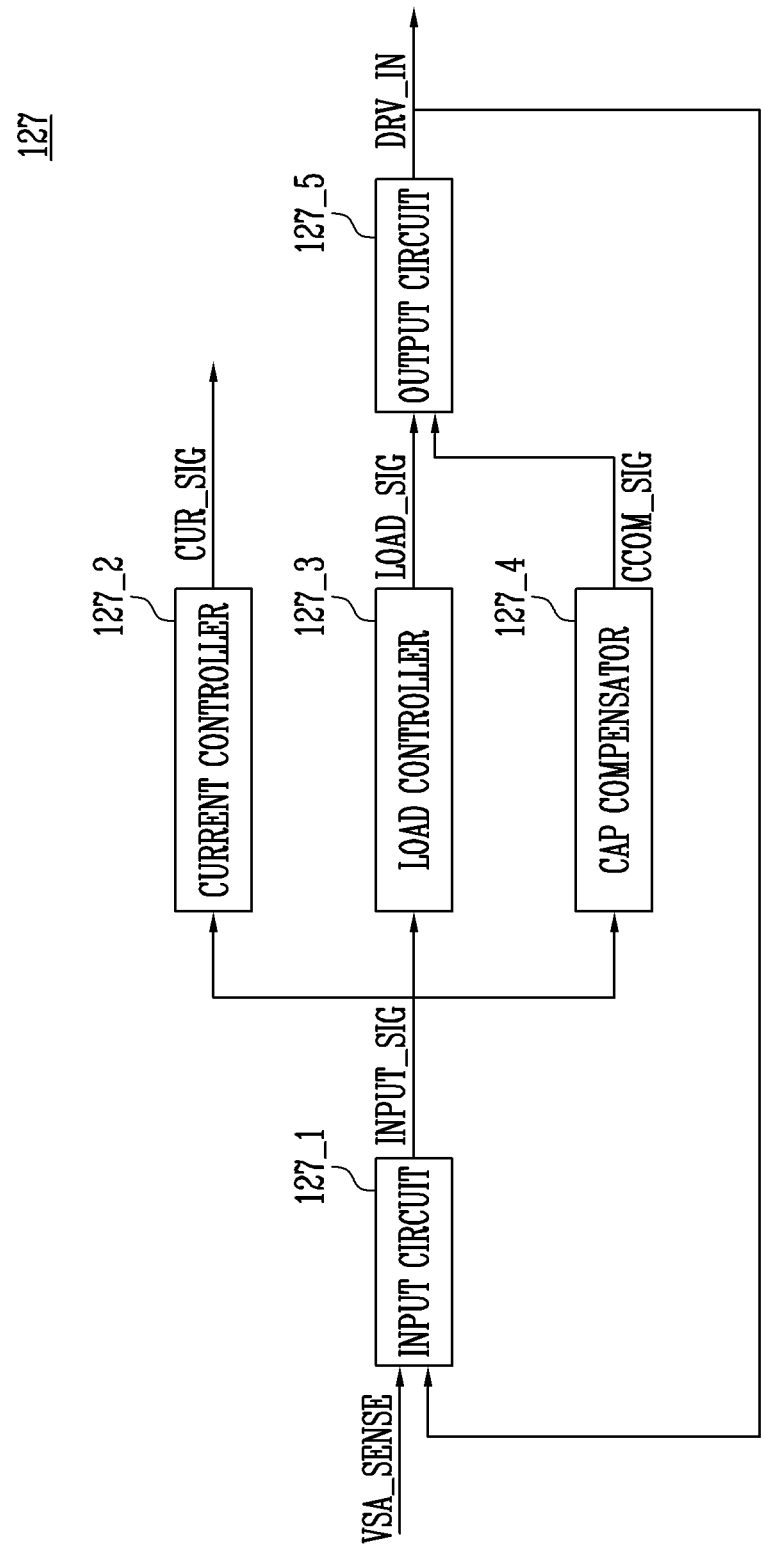
FIG. 14 illustrates operation of a driver for satisfying a characteristic of the SA_SENSE signal.

FIG. 14 illustrates the operation of the driver for satisfying the characteristic of the second sense signal SA_SENSE.

Since the driver 127 of FIG. 14 has the same configuration as that of FIG. 11, only the generated signal SA_SENSE is different, common aspects are not described again.

In an embodiment, the driver 127 of FIG. 14 may include the input circuit 127_1, the current controller 127_2, the load controller 127_3, the cap compensator 127_4, and the output circuit 127_5.

In FIG. 14, it is assumed that the generated signal is the second sense signal SA_SENSE. Therefore, the voltage selected from the multiplexer 128 of FIG. 7 may be the second sense voltage VSA_SENSE, and the second sense voltage VSA_SENSE may be input to the input circuit 127_1 together with the feedback voltage DRV_IN. The input circuit 127_1 may output the input signal INPUT_SIG for generating the second sense signal SA_SENSE.

Referring to FIGS. 13 and 14, it may be required to prevent the second sense signal SA_SENSE from decreasing to a voltage of a specific level within a specific time or it may be required to rapidly recover from such a decrease. The driver 127 and the control signal generator 129 may operate simultaneously.

In an embodiment, the output terminal load of the driver 127 is increased and the current flowing through the entire driver 127 is increased so that the second sense signal SA_SENSE is prevented from decreasing to the voltage of the specific level or can be rapidly recovered from the decreased level to the original level. However, in case of FIG. 14, differently from that of FIG. 11, a cap compensation signal CCOM_SIG may be output from the cap compensator 127_4 to increase the load of the output terminal of the driver 127. That is, in response to the cap compensation signal CCOM_SIG, cap compensator 127_4 may couple a cap to of a load of an output terminal.

Specifically, the current controller 127_2 may output the current signal CUR_SIG for increasing the current flowing through the entire driver 127 based on the input signal INPUT_SIG for generating the second sense signal SA_SENSE. To do so, the current signal CUR_SIG may be in a high state.

In addition, the load controller 127_3 may output the load signal LOAD_SIG for increasing the load of the output circuit 127_5. To do so, the load signal LOAD_SIG may be in a high state.

The cap compensator 127_4 may output the cap compensation signal CCOM_SIG for increasing the load of the output circuit 127_5. At this time, the cap compensation signal CCOM_SIG may be in a high state.

Figure 15:
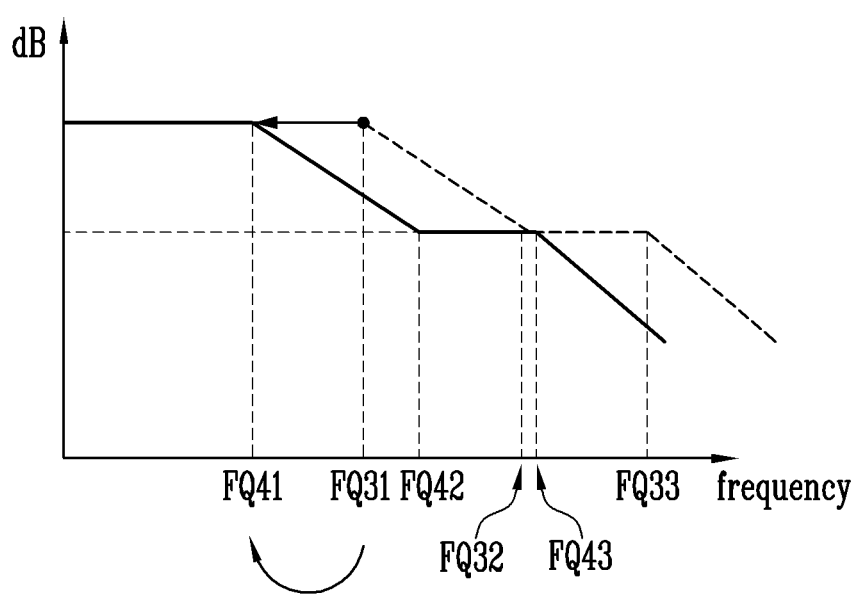
FIG. 15 illustrates an AC characteristic when the SA_SENSE signal is generated.

FIG. 15 illustrates an AC characteristic when the SA_SENSE signal is generated.

Referring to FIG. 15, FIG. 15 illustrates the AC characteristic of the SA_SENSE signal generated to prevent a decrease or, when decrease occurs, perform a fast recovery to restore SA_SENSE from the decreased level to its original level.

In FIG. 15, the horizontal axis represents a frequency of the SA_SENSE signal, and the vertical axis represents a ratio (dB) of a magnitude of a voltage.

In an embodiment, referring to FIG. 15, in order to generate and maintain the SA_SENSE signal at the required levels, i.e., avoid decrease or if decrease occurs recover rapidly, the load of the output terminal of the driver 127 of FIG. 7 is increased, and the current flowing through the entire driver 127 is increased.

Therefore, the current flowing through the entire driver 127 may be increased based on the current signal CUR_SIG output from the current controller 127_2 of FIG. 14, and the load of the output terminal of the driver 127 may be increased based on the load signal LOAD_SIG of the high state output from the load controller 127_3 of FIG. 7 and the cap compensation signal CCOM_SIG output from the cap compensator 127_4 of FIG. 7.

When the current flowing through the entire driver 127 of FIG. 7 is increased and the load of the output terminal of the driver 127 is increased, the second sense signal SA_SENSE of a low frequency may be generated.

For example, the second sense signal SA_SENSE having a frequency of FQ31 may be changed to a frequency of FQ41 and generated. The second sense signal SA_SENSE may also be changed from FQ32 to FQ42 and from FQ33 to FQ43, that is, to a low frequency.

Figure 16:
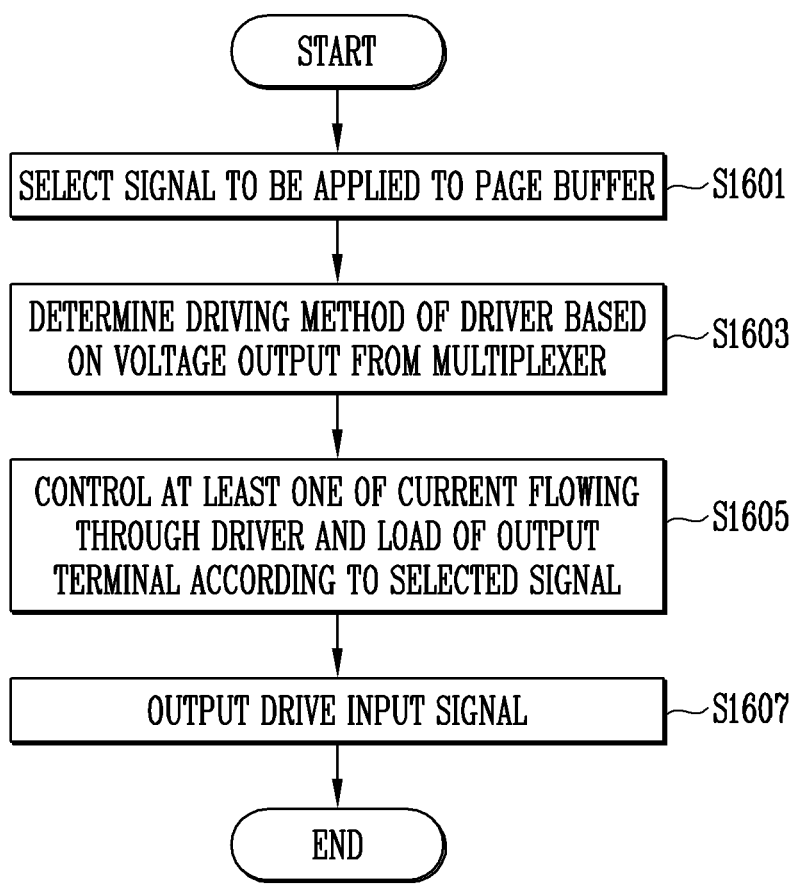
FIG. 16 is a diagram illustrating an operation of a driver according to an embodiment of the present disclosure.

FIG. 16 is a diagram illustrating the operation of the driver according to an embodiment of the present disclosure.

Referring to FIG. 16, in operation S1601, the signal to be applied to the page buffer may be selected. For example, when a plurality of voltages are input to the multiplexer, any one of the plurality of voltages may be determined according to an enable signal input to the multiplexer. The signal to be applied to the page buffer in the memory device may be generated based on the determined voltage. That is, the signal to be applied to the page buffer may be selected based on the voltage output from the multiplexer.

In operation S1603, a driving method of the driver may be determined based on the selected signal, that is, the voltage output from the multiplexer.

For example, when the voltage output from the multiplexer is the third sense voltage VTRAN_PB corresponding to the third sense signal TRAN_PB, it may be determined that the driver first operates and then the driver and the control signal generator operate together.

However, when the voltage output from the multiplexer is the second sense voltage VSA_SENSE corresponding to the second sense signal SA_SENSE, the operation of the driver and the control signal generator may be simultaneously started and operated.

In operation S1603, when the driving method of the driver is determined, in operation S1605, at least one of the current flowing through the driver and the load of the output terminal of the driver may be controlled according to the selected signal.

Specifically, when the selected signal is the third sense signal TRAN_PB, the driver may be first operated, and then the operation for reducing the load of the output terminal of the driver and an operation for reducing the current flowing through the entire driver may be performed. At this time, the control signal may be output from the current controller and the load controller in the driver to reduce the load of the output terminal of the driver and reduce the current flowing through the entire driver.

Thereafter, when the driver and the control signal generator start to operate together, the control signal may be output from the current controller and the load controller in the driver to increase the load of the output terminal and increase the current flowing through the driver.

In another example, when the second sense signal SA_SENSE is selected, it may be determined that the driver and the control signal generator start the operation together. Therefore, the control signal may be output from the current controller, the load controller, and the cap compensator in the driver to increase the load of the output terminal of the driver and increase the current flowing through the driver.

In operation S1607, the drive input signal may be output from the driver. The signal to be applied to the page buffer may be generated based on the drive input signal. The signal applied to the page buffer may be the second sense signal SA_SENSE or the third sense signal TRAN_PB. That is, the second sense signal SA_SENSE or the third sense signal TRAN_PB may be generated by the control signal generator based on the drive input signal from the driver, and the generated signal may be applied to the page buffer.

Figure 17:
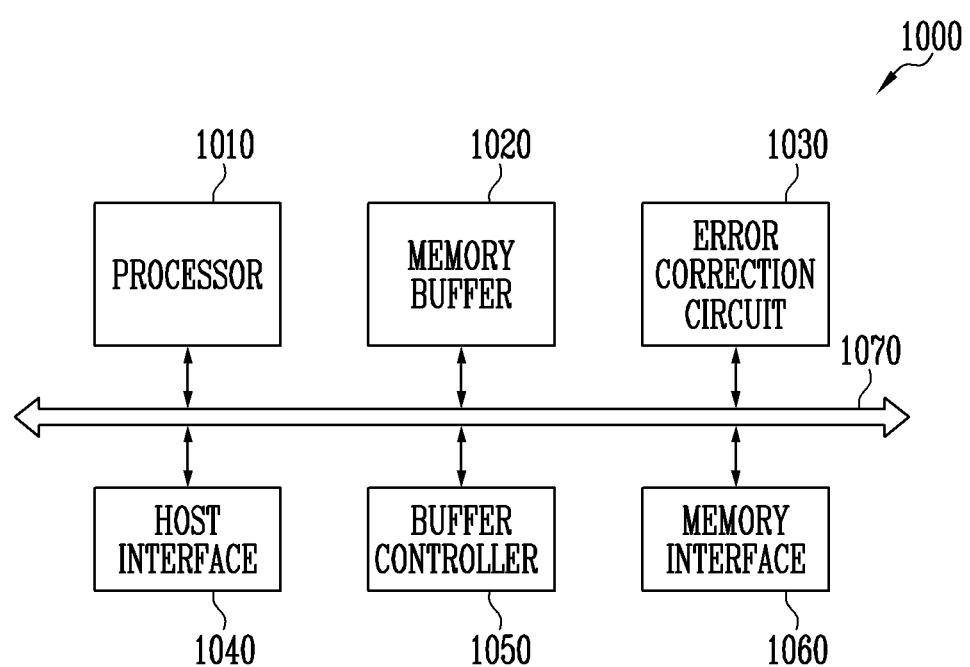
FIG. 17 is a diagram illustrating another embodiment of the memory controller of FIG. 1.

FIG. 17 is a diagram illustrating another embodiment of the memory controller of FIG. 1.

The memory controller 1000 is connected to a host and the memory device. The memory controller 1000 is configured to access the memory device in response to the request from the host, e.g., host 300 of FIG. 1. For example, the memory controller 1000 is configured to control write, read, erase, and background operations of the memory device. The memory controller 1000 is configured to provide an interface between the memory device and the host. The memory controller 1000 is configured to drive firmware for controlling the memory device.

Referring to FIG. 17, the memory controller 1000 may include a processor 1010, a memory buffer 1020, an error correction circuit (ECC) 1030, a host interface 1040, a buffer controller (or buffer control circuit) 1050, a memory interface 1060, and a bus 1070.

The bus 1070 may be configured to provide a channel between components of the memory controller 1000.

The processor 1010 may control overall operation of the memory controller 1000 and may perform a logical operation. The processor 1010 may communicate with the host through the host interface 1040 and communicate with the memory device through the memory interface 1060. In addition, the processor 1010 may communicate with the memory buffer 1020 through the buffer controller 1050. The processor 1010 may control an operation of the storage device using the memory buffer 1020 as an operation memory, a cache memory, or a buffer memory.

The processor 1010 may perform a function of the FTL. The processor 1010 may translate the LBA provided by the host into the PBA through the FTL. The FTL may receive the LBA by using a mapping table and translate the LBA into the PBA. Any of various address mapping methods may be applied by the flash translation layer. Which address mapping unit is applied depends on the mapping unit used by the memory controller 1000. Examples of address mapping methods include a page mapping method, a block mapping method, and a hybrid mapping method.

The processor 1010 is configured to randomize data received from the host. For example, the processor 1010 may randomize the data received from the host using a randomizing seed. The randomized data is provided to the memory device as data to be stored and is programmed to the memory cell array.

The processor 1010 may perform the randomization and the de-randomization by driving software or firmware.

The memory buffer 1020 may be used as an operation memory, a cache memory, or a buffer memory of the processor 1010. The memory buffer 1020 may store codes and commands executed by the processor 1010. The memory buffer 1020 may store data processed by the processor 1010. The memory buffer 1020 may include a static RAM (SRAM) or a dynamic RAM (DRAM).

The error correction circuit 1030 may perform error correction. The error correction circuit 1030 may perform error correction encoding (ECC encoding) based on data to be written to the memory device through memory interface 1060. The error correction encoded data may be transferred to the memory device through the memory interface 1060. The error correction circuit 1030 may perform error correction decoding (ECC decoding) on the data received from the memory device through the memory interface 1060. For example, the error correction circuit 1030 may be included in, as a component of, the memory interface 1060.

The host interface 1040 is configured to communicate with an external host under control of the processor 1010. The host interface 1040 may be configured to perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection express (PCI-E), a nonvolatile memory express (NVMe), a universal flash storage (UFS), a secure digital (SD), a multimedia card (MMC) of an embedded MMC (eMMC), a dual in-line memory module (DIMM), a registered DIMM (RDIMM), and/or a load reduced DIMM (LRDIMM).

The buffer controller 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

For example, the memory controller 1000 may not include the memory buffer 1020 and the buffer controller 1050.

For example, the processor 1010 may control the operation of the memory controller 1000 using codes. The processor 1010 may load the codes from a non-volatile memory device (for example, a read only memory) provided inside the memory controller 1000. As another example, the processor 1010 may load the codes from the memory device through the memory interface 1060.

For example, the bus 1070 of the memory controller 1000 may be divided into a control bus and a data bus. The data bus may be configured to transmit data within the memory controller 1000 and the control bus may be configured to transmit control information such as a command and an address within the memory controller 1000. The data bus and the control bus may be separated from each other so as not to interfere with, nor affect, each other. The data bus may be connected to the host interface 1040, the buffer controller 1050, the error correction circuit 1030, and the memory interface 1060. The control bus may be connected to the host interface 1040, the processor 1010, the buffer controller 1050, the memory buffer 1202, and the memory interface 1060.

Figure 18:
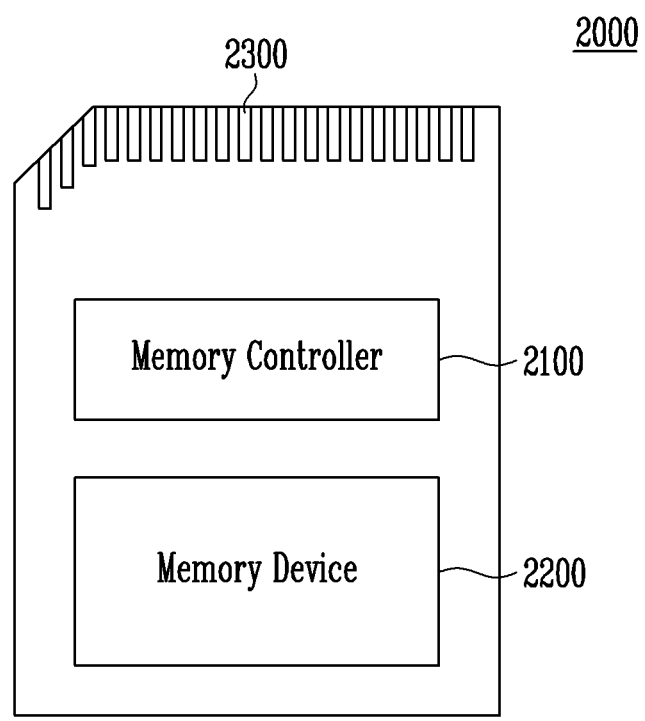
FIG. 18 is a block diagram illustrating a memory card system to which a storage device is applied according to an embodiment of the present disclosure.

FIG. 18 is a block diagram illustrating a memory card system to which the storage device is applied according to an embodiment of the present disclosure.

Referring to FIG. 18, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and the host. The memory controller 2100 is configured to drive firmware for controlling the memory device 2200. The memory device 2200 may be implemented to be the same as the memory device 100 of FIG. 1 and FIG. 2.

As an example, the memory controller 2100 may include components such as a random access memory (RAM), a processor, a host interface, a memory interface, and an error correction circuit.

The memory controller 2100 may communicate with an external device through the connector 2300. The memory controller 2100 may communicate with an external device (for example, the host) according to a specific communication standard. As an example, the memory controller 2100 is configured to communicate with an external device through at least one of various communication standards such as a universal serial bus (USB), a multi-media card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and/or an NVMe. As an example, the connector 2300 may be defined by at least one of the various communication standards described above.

As an example, the memory device 2200 may be implemented as any of various non-volatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and/or a spin transfer torque magnetic RAM (STT-MRAM).

The memory controller 2100 and the memory device 2200 may be integrated into one semiconductor device to configure a memory card, such as a PC card (personal computer memory card international association (PCMCIA)), a compact flash card (CF), a smart media card (SM or SMC), a memory stick, a multimedia card (MMC, RS-MMC, MMC-micro, or eMMC), an SD card (SD, miniSD, microSD, or SDHC), and/or a universal flash storage (UFS).

Figure 19:
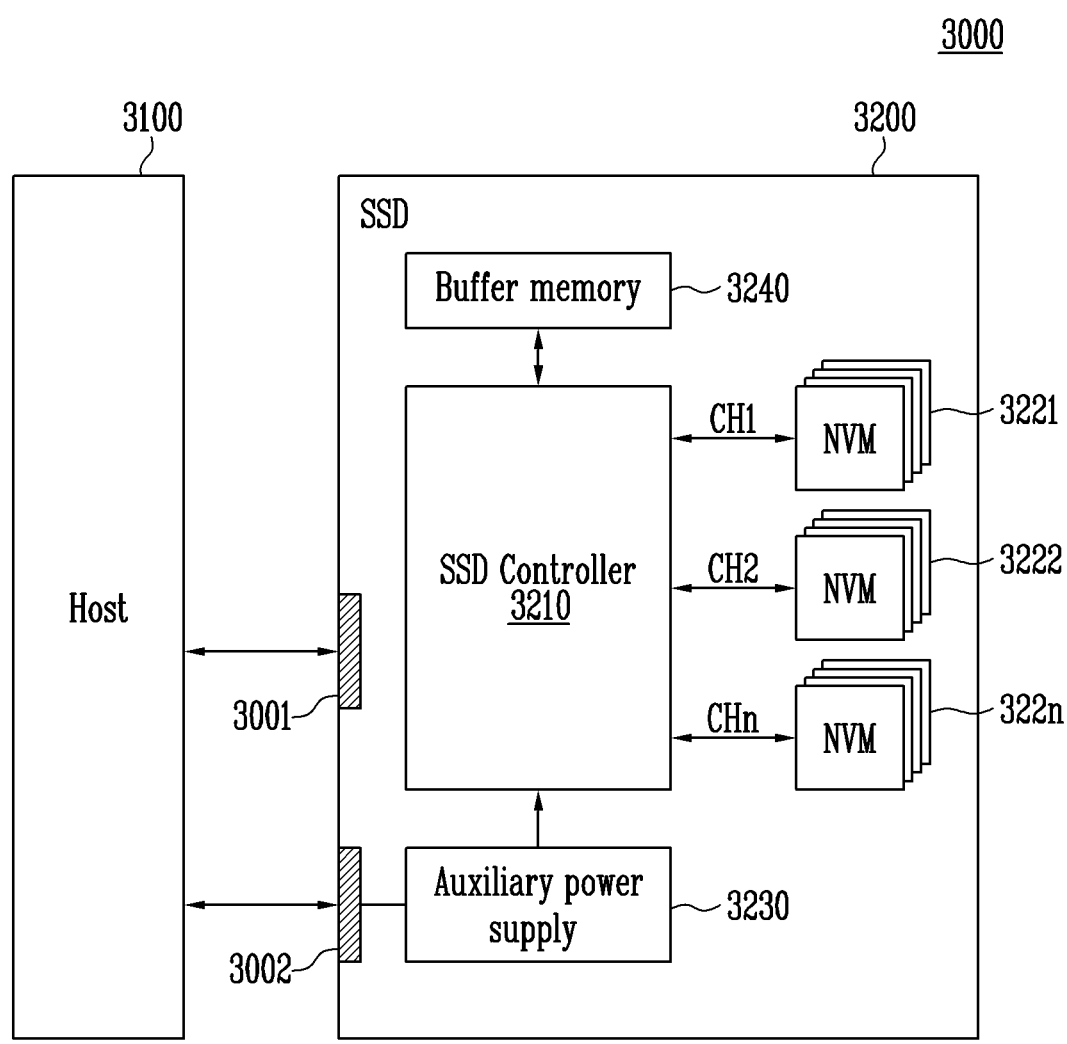
FIG. 19 is a block diagram illustrating a solid state drive (SSD) system to which a storage device is applied according to an embodiment of the present disclosure.

FIG. 19 is a block diagram illustrating a solid state drive (SSD) system to which the storage device is applied according to an embodiment of the present disclosure.

Referring to FIG. 19, the SSD system 3000 includes a host 3100 and an SSD 3200. The SSD 3200 exchanges a signal SIG with the host 3100 through a signal connector 3001 and receives power PWR through a power connector 3002. The SSD 3200 includes an SSD controller 3210, a plurality of flash memories 3221 to 322$n$, an auxiliary power device 3230, and a buffer memory 3240.

In an embodiment, the SSD controller 3210 may function the same as the memory controller 200 of FIG. 1.

The SSD controller 3210 may control the plurality of flash memories 3221 to 322$n$ in response to the signal(s) SIG received from the host 3100. As an example, the signal(s) SIG may be based on an interface between the host 3100 and the SSD 3200. For example, the signal(s) SIG may be defined by at least one of interfaces such as a universal serial bus (USB), a multi-media card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and/or an NVMe.

The auxiliary power device 3230 is connected to the host 3100 through the power connector 3002. The auxiliary power device 3230 may receive the power PWR from the host 3100 and may charge the power. The auxiliary power device 3230 may provide power of the SSD 3200 when power supply from the host 3100 is not smooth. As an example, the auxiliary power device 3230 may be disposed in, or external to, the SSD 3200. For example, the auxiliary power device 3230 may be disposed on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322$n$, or may temporarily store metadata (for example, a mapping table) of the flash memories 3221 to 322$n$. The buffer memory 3240 may include a volatile memory such as a DRAM, an SDRAM, a DDR SDRAM, an LPDDR SDRAM, and/or a GRAM, or a non-volatile memory such as an FRAM, a ReRAM, an STT-MRAM, and/or a PRAM.

Figure 20:
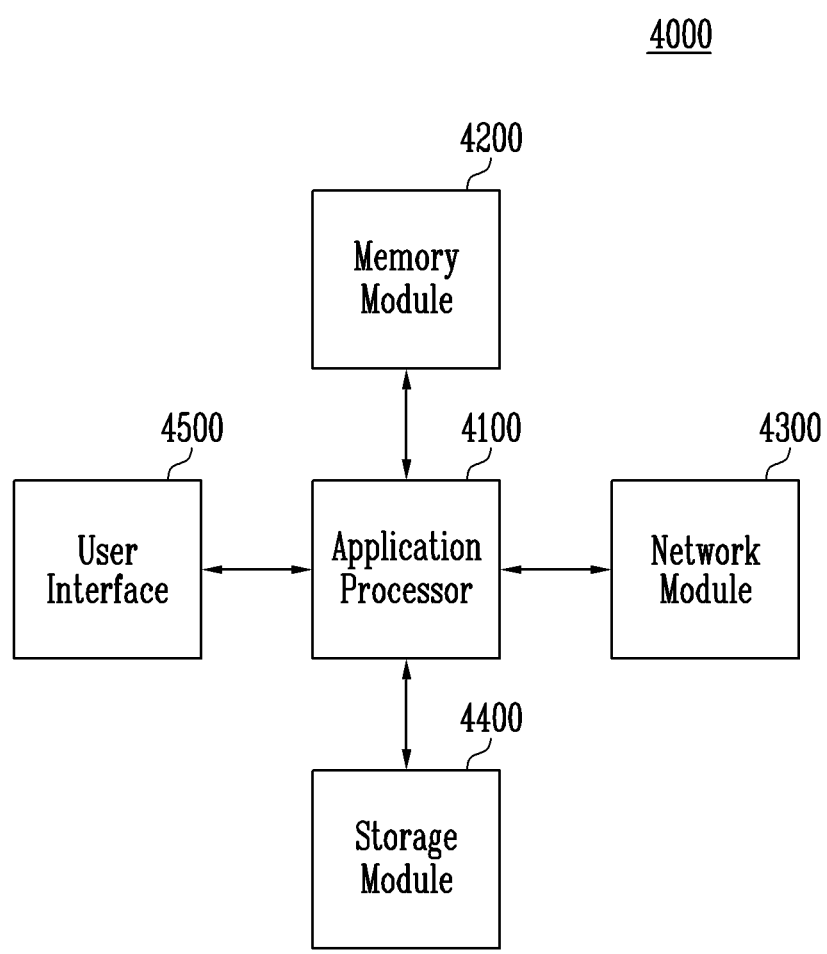
FIG. 20 is a block diagram illustrating a user system to which a storage device is applied according to an embodiment of the present disclosure.

FIG. 20 is a block diagram illustrating a user system to which the storage device is applied according to an embodiment of the present disclosure.

Referring to FIG. 20, the user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a non-volatile random access memory, such as a PRAM, a ReRAM, an MRAM, and an FRAM. For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and WI-FI. For example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented as a non-volatile semiconductor memory element such as a phase-change RAM (PRAM), a magnetic RAM (MRAM), a resistive RAM (RRAM), a NAND flash, a NOR flash, and a three-dimensional NAND flash. For example, the storage module 4400 may be provided as a removable storage device (removable drive), such as a memory card, and an external drive of the user system 4000.

For example, the storage module 4400 may include a plurality of non-volatile memory devices, each of which may operate identically to the memory device described with reference to FIGS. 2 and 3. The storage module 4400 may operate identically to the storage device 50 described with reference to FIG. 1.

The user interface 4500 may include interfaces for inputting data or an instruction to the application processor 4100 or for outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a monitor.

While the invention has been described in connection with specific embodiments, various modifications may be made as those skilled in the art will understand from the present disclosure. Thus, the present invention encompasses all such modifications that fall within the scope of the claims.

What is claimed is:

1. A driver comprising:
   a current controller configured to control total current flowing through the driver based on a selected signal, among a plurality of signals, applied to a page buffer that stores data;
   a load controller configured to control a magnitude of a load of an output terminal of the driver based on the selected signal; and
   a cap compensator configured to control the magnitude of the load of the output terminal by adjusting a capacitance of the load of the output terminal based on the selected signal.

2. The driver of claim 1, wherein, when the selected signal is a first signal, the current controller outputs a current signal for decreasing the total current.

3. The driver of claim 1, wherein, when the selected signal is a first signal, the load controller outputs a load signal for decreasing the magnitude of the load of the output terminal.

4. The driver of claim 3, wherein, after the magnitude of the load of the output terminal is decreased, a control signal generator for generating the first signal is operated with the driver to increase the magnitude of the load of the output terminal.

5. The driver of claim 4, wherein the current controller outputs a current signal for increasing the total current.

6. The driver of claim 4, wherein the load controller outputs the load signal for increasing the magnitude of the load of the output terminal.

7. The driver of claim 1, wherein, when the selected signal is a second signal, the current controller outputs a current signal for increasing the total current.

8. The driver of claim 1, wherein, when the selected signal is a second signal, the load controller outputs a load signal for increasing the magnitude of the load of the output terminal.

9. The driver of claim 8, wherein the cap compensator further controls the magnitude by outputting a cap compensation signal for increasing the capacitance according to the magnitude of the load of the output terminal controlled based on the load signal.

10. A method of operating a driver, the method comprising:
    determining a selected signal, among a plurality of signals, to be applied to a page buffer that stores data;
    controlling a total current flowing through the driver based on the selected signal;
    controlling a magnitude of a load of an output terminal of the driver based on the selected signal; and
    controlling the magnitude of the load of the output terminal by adjusting a capacitance of the load of the output terminal based on the selected signal.

11. The method of claim 10, wherein the controlling of the total current includes outputting, when the selected signal is a first signal, a current signal for decreasing the total current.

12. The method of claim 10, wherein the controlling of the magnitude of the load of the output terminal includes outputting, when the selected signal is a first signal, a load signal for decreasing the magnitude of the load of the output terminal.

13. The method of claim 12, wherein, after the magnitude of the load of the output terminal is decreased, the magnitude of the load of the output terminal is increased.

14. The method of claim 13, wherein the controlling of the total current includes outputting, after the magnitude of the load of the output terminal is increased, a current signal for increasing the total current.

15. The method of claim 13, wherein the controlling of the magnitude of the load of the output terminal further includes outputting the load signal for increasing the magnitude of the load of the output terminal.

16. The method of claim 10, wherein the controlling of the total current includes outputting, when the selected signal is a second signal, a current signal for increasing the total current.

17. The method of claim 10, wherein the controlling of the magnitude of the load of the output terminal includes outputting, when the selected signal is a second signal, a load signal for increasing the magnitude of the load of the output terminal.

18. The method of claim 17, wherein the controlling of the magnitude of the load of the output terminal includes outputting a cap compensation signal for increasing the capacitance according to the magnitude of the load of the output terminal controlled based on the load signal.

19. A memory device including a page buffer that stores data, the memory device comprising:

a multiplexer configured to, based on an enable signal, output a voltage signal from among a plurality of voltage signals;

a driver configured to control total current flowing through the driver and a magnitude of a load of an output terminal of the driver based on the voltage signal output from the multiplexer; and a control signal generator configured to generate a signal to be applied to the page buffer based on a drive input signal output from the output terminal of the driver.

20. The memory device of claim 19, wherein the driver comprises:

a current controller configured to control the total current based on the voltage signal;

a load controller configured to control the magnitude of the load of the output terminal based on the voltage signal; and a cap compensator configured to control the magnitude of the load of the output terminal by increasing or decreasing a capacitance of the load of the output terminal based on the voltage signal.

\* \* \* \* \*